(12) United States Patent
Gans et al.

(10) Patent No.: US 10,788,985 B2
(45) Date of Patent: Sep. 29, 2020

(54) APPARATUSES AND METHODS FOR CONFIGURABLE MEMORY ARRAY BANK ARCHITECTURES

(71) Applicant: MICRON TECHNOLOGY, INC., Boise, ID (US)

(72) Inventors: Dean D. Gans, Nampa, ID (US); Shunichi Saito, Ebina (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/452,424

(22) Filed: Jun. 25, 2019

(65) Prior Publication Data

US 2020/0004420 A1    Jan. 2, 2020

Related U.S. Application Data

(63) Continuation of application No. 16/022,421, filed on Jun. 28, 2018, now Pat. No. 10,372,330.

(51) Int. Cl.
*G06F 3/06* (2006.01)
*G06F 12/10* (2016.01)

(52) U.S. Cl.
CPC .......... *G06F 3/0604* (2013.01); *G06F 3/0629* (2013.01); *G06F 3/0673* (2013.01); *G06F 12/10* (2013.01); *G06F 2212/1012* (2013.01)

(58) Field of Classification Search
CPC ....... G06F 3/0604; G06F 3/0673; G06F 12/10

USPC ..................................................... 365/230.03
See application file for complete search history.

(56) References Cited

U.S. PATENT DOCUMENTS

| | | |
|---|---|---|
| 9,870,325 B2 | 1/2018 | Bains |
| 2003/0198098 A1 | 10/2003 | Fujioka et al. |
| 2012/0087201 A1 | 4/2012 | Moon |
| 2012/0195144 A1 | 8/2012 | Ide et al. |
| 2013/0058175 A1 | 3/2013 | Lin et al. |
| 2016/0342539 A1 | 11/2016 | Bains |
| 2018/0276149 A1 | 9/2018 | Bains |

FOREIGN PATENT DOCUMENTS

WO    2008022454 A1    2/2008

OTHER PUBLICATIONS

International Search Report and Written Opinion received in PCT Application No. PCT/US2019/038773 dated Oct. 8, 2019.

*Primary Examiner* — Xiaochun L Chen
(74) *Attorney, Agent, or Firm* — Dorsey & Whitney LLP

(57) ABSTRACT

Apparatuses and methods for configurable memory array bank architectures are described. An example apparatus includes a mode register configured to store information related to bank architecture and a memory array including a plurality of memory banks. The plurality of memory banks are configured to be arranged in a bank architecture based at least in part on the information related to bank architecture stored in the mode register.

31 Claims, 11 Drawing Sheets

| Bank Architecture | Address Array Mapping ||||| 
|---|---|---|---|---|---|
| | BG | BA0 | BA1 | BG0 | BG1 |
| | 8B | BA0 | BA1 | BA2 | B4 |
| | 16B | BA0 | BA1 | BA2 | BA3 |

APPARATUSES AND METHODS FOR CONFIGURABLE MEMORY ARRAY BANK ARCHITECTURES

CROSS-REFERENCE TO RELATED APPLICATION

This application is a continuation of U.S. patent application Ser. No. 16/022,421, filed Jun. 28, 2018, issued as U.S. Pat. No. 10,372,330 on Aug. 6, 2019, This application and patent are incorporated by reference herein in their entirety and for all purposes.

BACKGROUND

Semiconductor memories are used in many electronic systems to store data that may be retrieved at a later time. Semiconductor memories are generally controlled by providing the memories with commands, addresses, and clocks. The commands, addresses, and clocks ma be provided by a memory controller, for example. The commands may control the semiconductor memories to perform various memory operations. For example a read command causes the semiconductor memory to perform a read operation to retrieve data from a memory, and a write command causes the semiconductor memory to perform a write operation to store data to the memory. The addresses identify the memory location for the access operation, and the docks provide timing for the various operations and provision of data.

As the number of different types of electronic systems increases, it becomes more challenging to design semiconductor memories that can meet the different memory operating requirements and configurations demanded. Once designed, a conventional semiconductor memory is often limited to operating according to an internal architecture that may suit the needs of some electronic systems but not others. The limitations of the semiconductor memory may force the electronic system designer to compromise the performance of such systems, which is an undesirable approach to resolving the problem. As such, it may be desirable to have semiconductor memories with flexible architectures to meet design demands of different types of electronic systems.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
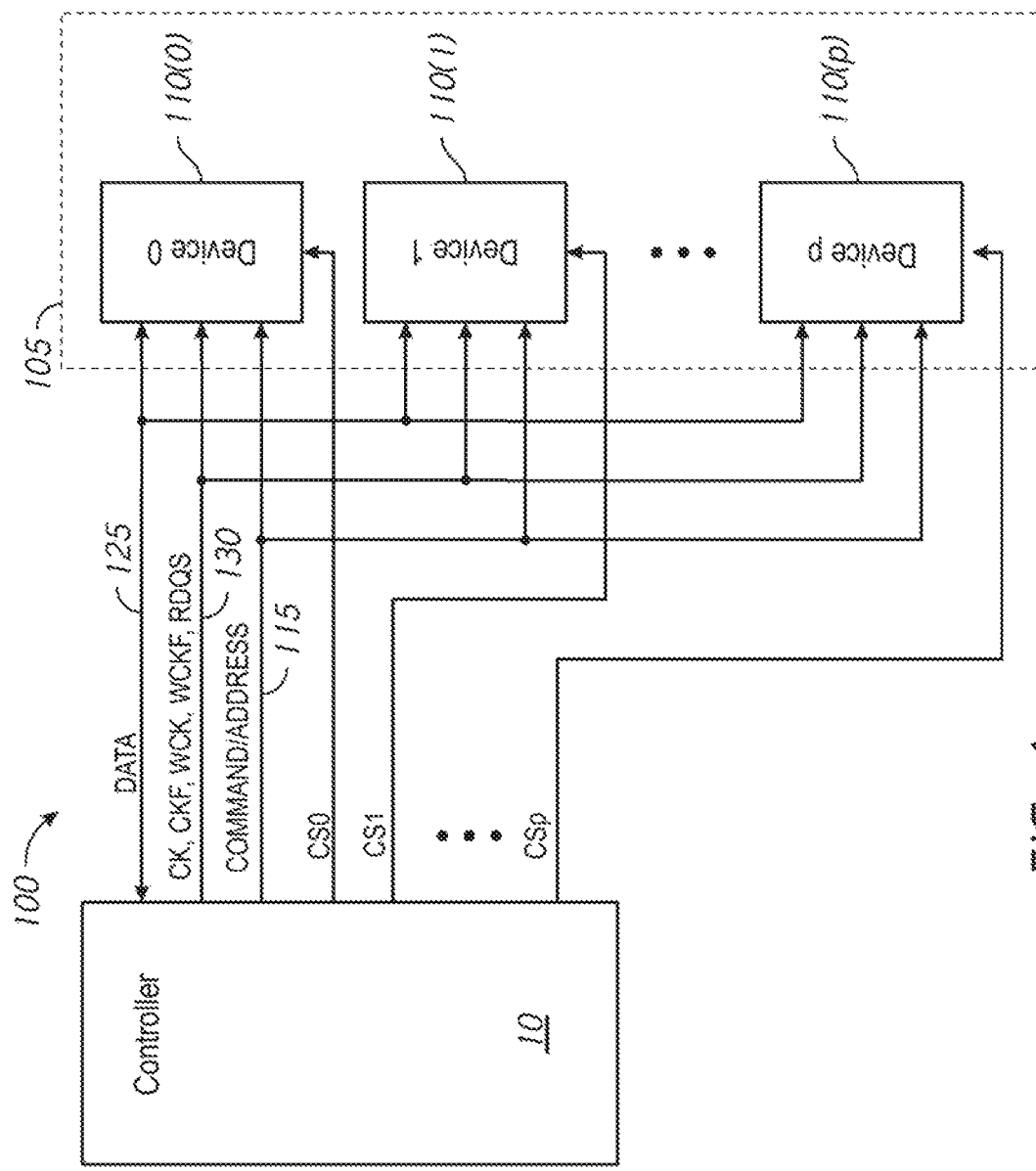
FIG. 1 is a block diagram of a system according to an embodiment of the disclosure.

FIG. 1 is a block diagram of a system 100 according to an embodiment of the disclosure. The system 100 includes a controller 10 and a memory system 105. The memory system 105 includes memories 110(0)-110(p) (e.g., "Device 0" through "Device p"), where p is a non-zero whole number. The memories 110 may be dynamic random access memory (DRAM), such as low power double data rate (LPDDR) DRAM in some embodiments of the disclosure. The controller 10 and the memory system 105 are in communication over several busses. For example, commands and addresses are received by the memory system 105 on a command/address bus 115, and data is provided between the controller 10 and the memory system 105 over a data bus 125. Various clocks may be provided between the controller and memory system 105 over a clock bus 130. The clock bus 130 may include signal lines for providing system clocks CK and CKF to the memory system 105, data clocks WCK and WCKF to the memory system 105, and an access data clock RDQS provided by the memory system 105 to the controller 10. Each of the busses may include one or more signal lines on which signals are provided. The memories 110(0)-110(p) are each coupled to the command/address, data, and clock busses.

The CK and CKF clocks provided by the controller 10 to the memory system 105 are used for timing the provision and receipt of the commands and addresses. The WCK and WCKF clocks and the RDQS clock are used for timing the provision of data. For example, a bit of data may be provided from each external terminal DQ at rising and falling clock edges of the WCK and WCKF clocks. The CK and CKF clocks are complementary and the WCK and WCKF clocks are complementary. Clocks are complementary when a rising clock edge of a first clock occurs at the same time as a falling clock edge of a second clock, and when a falling clock edge of the first clock occurs at the same time as a rising clock edge of the second clock. The WCK and WCKF clocks may have a higher clock frequency than the CK and CKF clocks. For example, in some embodiments of the disclosure, the WCK and WCKF clocks may have a clock frequency that is four times the clock frequency of the CK and CKF clocks. The WCK and WCKF clocks may be provided by the controller 10 to the memory system 105 continuously during access operations to improve timing performance for the access operations. Alternatively, the controller 10 does not provide the WCK and WCKF clocks continuously, but may provide the WCK and WCKF clocks when needed for an access operation.

The controller 10 provides commands to the memory system 105 to perform memory operations. Non-limiting examples of memory commands include access commands for accessing the memory, such as read commands for performing read operations and write commands for performing write operations, mode register write and read commands for performing mode register write and read operations, as well as other commands. The commands provided by the controller 10 to the memory system 105 further include select signals (e.g., chip select CS signals CS0, CS1, CSp). While all of the memories 110 are provided the commands, addresses, data and clocks, the select signals are provided on respective select signal lines, and are used to select which of the memories 110 will respond to the command and perform the corresponding operation. In some embodiments of the disclosure, a respective select signal is provided to each memory 110 of the memory system 105. The controller 10 provides an active select signal to select the corresponding memory 110. While the respective select signal is active, the corresponding memory 100 is selected to receive the commands and addresses provided on the command/address bus 115.

In operation, when a read command and associated address are provided by the controller 10 to the memory system 105, the memory 110 selected by an active select signal receives the read command and associated address, and performs a read operation to provide the controller 10 with read data from a memory location corresponding to the associated address. The read data, is provided by the selected memory 110 to the controller 10 according to a timing relative to receipt of the read command. For example, the timing may be based on a read latency (RL) value that indicates the number of clock cycles of the CK and CKF clocks (a clock cycle of the CK and CKF clocks is referenced as tCK) after the read command when the read data is provided by the selected memory 110 to the controller 10. The RL value is programmed by the controller 10 in the memories 110. For example, the RL value may be programmed in respective mode registers of the memories 110. As known, mode registers included in each of the memories 110 may be programmed with information for setting (e.g., selecting from) various operating modes and/or to select features for operation of the memories. One of the settings may be for the RL value.

In preparation of the selected memory 110 providing the read data to the controller 10, the controller provides active WCK and WCKF clocks to the memory system 105. The WCK and WCKF clocks may be used by the selected memory 110 to generate an access data clock RDQS. A clock is active when the clock transitions between low and high clock levels periodically. Conversely, a clock is inactive when the clock maintains a constant clock level and does not transition periodically. The RDQS clock is provided by the memory 110 performing the read operation to the controller 10 for timing the provision of read data to the controller 10.

In operation, when a write command and associated address are provided by the controller 10 to the memory system 105, the memory 110 selected by an active select signal receives the write command and associated address, and performs a write operation to write data provided by the controller 10 to a memory location corresponding to the associated address. The write data is provided to the selected memory 110 by the controller 10 according to a timing relative to receipt of the write command. For example, the timing may be based on a write latency (WL) value that indicates the number of clock cycles of the CK and CKF clocks after the write command when the write data is provided to the selected memory 110 by the controller 10. The WL value is programmed by the controller 10 in the memories 110. For example, the WL value may be programmed in respective mode registers of the memories 110.

In preparation of the selected memory 110 receiving the write data from the controller 10, the controller provides active WCK and WCKF clocks to the memory system 105. The WCK and WCKF clocks may be used by the selected memory 110 to generate internal clocks for timing the operation of circuits to receive the write data. The data is provided by the controller 10 and the selected memory 110 receives the write data according to the WCK and WCKF clocks. The write data is written to memory corresponding to the associated addresses.

Figure 2:
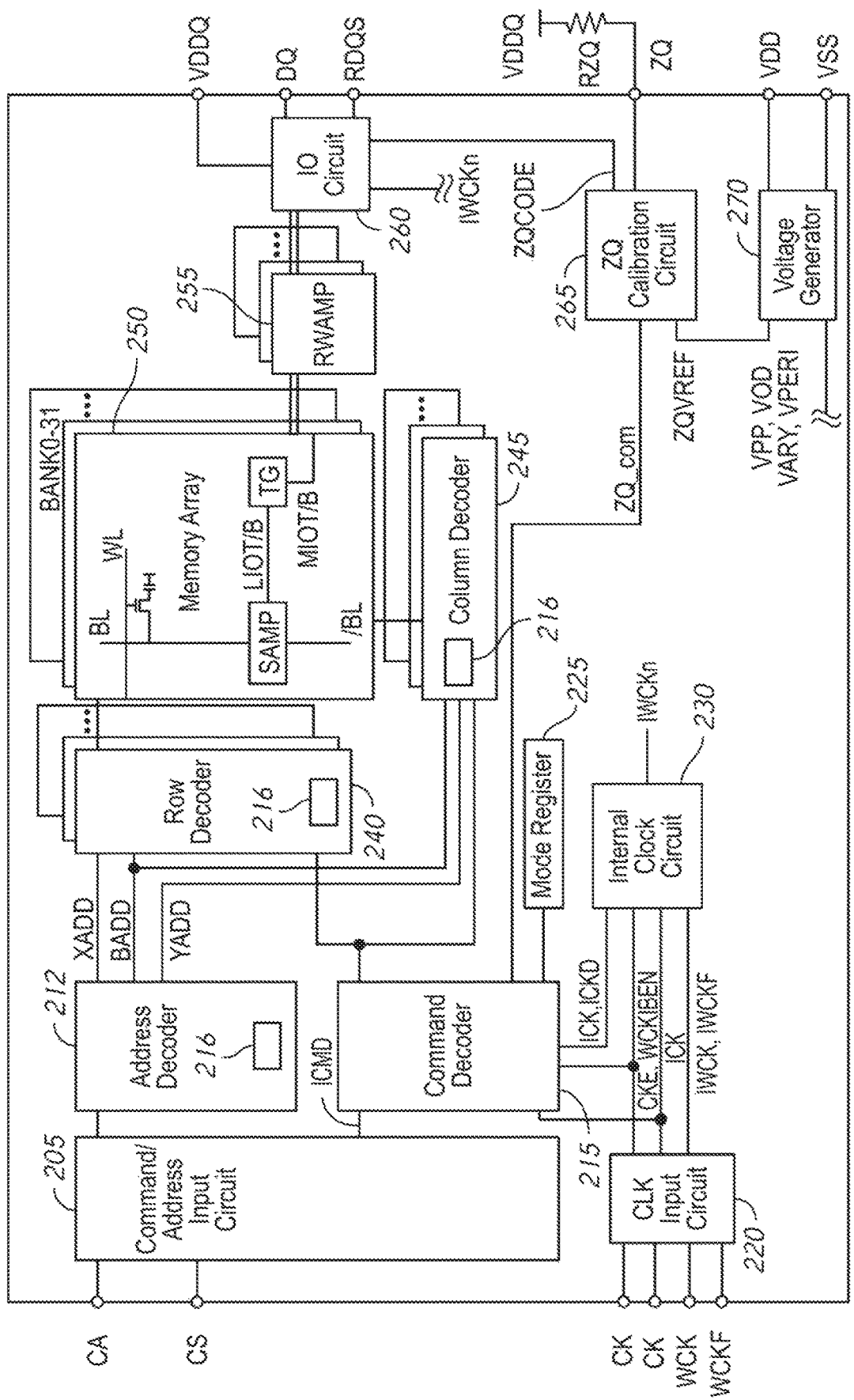
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred as such. In some embodiments, the semiconductor device 200 may include, without limitation, a memory, such as a LPDDR memory integrated into a single semiconductor die, for example. In some embodiments of the disclosure, the semiconductor die may include only semiconductor device 200. In some embodiments of the disclosure, the semiconductor die may include the semiconductor device 200 embedded with other systems integrated on the same semiconductor die. The semiconductor device 200 may be included in the memory system 100 of FIG. 1 in some embodiments of the disclosure. For example, each of the memories 110 may include a semiconductor device 200. The semiconductor device 200 may include a memory array 250. The memory array 250 includes a plurality of memory banks. The memory banks of the memory array 250 may be arranged in different bank architectures. For example, the memory banks of the memory array 250 may be arranged in bank architectures with a bank group mode configuration, a bank mode configuration, as well as other memory bank configurations. Each of the memory banks include a plurality of word lines WL, a plurality of bit lines BL, and a plurality of memory cells MC arranged at intersections of the plurality of word lines WL and the plurality of bit lines BL. The selection of the word line WL is performed by a row decoder 240 and the selection of the bit line BL is performed by a column decoder 245. Sense amplifiers (SAMP) are connected to corresponding bit lines BL and further connected to at least one respective local I/O line pair (LIOT/B), which is in turn coupled to at least respective one main I/O line pair (MIOT/B), via transfer gates (TG), which function as switches.

The semiconductor device 200 may employ a plurality of external terminals that include command/address terminals CA coupled to a command/address bus to receive commands and addresses, a select terminal to receive a select signal CS, clock terminals to receive clocks CK and CKF, data clock terminals to receive data clocks WCK and WCKF, data terminals DQ, an access data clock terminal to provide an access data clock RDQS, power supply terminals VDD, VSS, and VDDQ, and the ZQ calibration terminal (ZQ).

When the CS signal provided to the select terminal is active, the semiconductor device 200 is activated to receive the commands and addresses supplied to the command/address terminals CA. The commands and addresses are received responsive to the CK and CKF clocks.

The command/address terminals CA may be supplied with commands from, for example, a memory controller. The commands may be provided as internal command signals ICMD to a command decoder 215 via the command/address input circuit 205. The command decoder 215 includes circuits to decode the internal command signals ICMD to generate various internal signals and commands for performing operations, for example, internal signals to control the circuits of the semiconductor device 200 to access the memory array 250 based on the commands, such as to read data from or write data to the memory array 250 based on a read command or a write command, respectively.

The command decoder 215 also accesses a mode register 225 that stores information for setting (e.g., selecting from) various modes and features of operation for the semiconductor device 200. The mode register 225 may be programmed with and store information for setting various operating modes and/or to select features for operation of the memories. For example, the mode register 225 may include registers that are programmed with and store information for operands that correspond to each of the various operating modes and features. For example, the mode register 225 may be programmed with information for operands corresponding to data access latency, such as read latency or write latency. As another example, the mode register 225 may be programmed with information for operands corresponding to burst length. The burst length defines a number of data bits provided from or to each of the data terminals DQ per access operation (e.g., read or write operation). For example, a burst length of 16 defines 16-bits of data will be provided from or to each of the data terminals DQ per access operation, and a burst length of 32 defines 32-bits of data will be provided from or to each of the data terminals DQ per access operation. As another example, the mode register 225 may be programmed with information for operands corresponding to modes of bank architecture in order to select from a set of bank architectures for the memory array 250. Examples of bank architectures may include bank group mode configuration, bank mode configuration, and the like. The various bank architectures allow the memory banks of the memory array 250 to be arranged in a manner for access by varied system configurations, for example. The information stored by the mode register 225 may be programmed by providing the semiconductor device 200 a mode register write command, which causes the semiconductor device 200 to perform a mode register write operation. The command decoder 215 accesses the mode register 225, and based on the stored information along with the internal command signals provides the internal signals to control the circuits of the semiconductor device 200 accordingly. For example, when accessing the memory array 250 for a access command, such as a read or write command, the command decoder 215 provides the internal signals to control the circuits of the semiconductor device 200 to access the memory array 250 as arranged according to the bank architecture that is set by the information stored in the mode register 225 for the modes related to bank architecture.

In some embodiments of the disclosure, the mode register 225 may include a plurality of registers for particular ones of the various modes and features that may be set through the mode register. For example, a mode register may include multiple registers corresponding to a read latency setting. Likewise, the mode register may include multiple registers corresponding to a write latency setting. The multiple registers for a particular mode or feature allows for multiple settings to be programmed and stored for the particular mode or feature. The setting for the mode or feature may be quickly switched between the multiple settings by instructing the semiconductor device to switch from one of the registers for the particular mode or feature to another one of the registers for the same particular mode or feature. As another example, the mode register 225 may include multiple registers for bank architecture to store information to switch between multiple bank architecture settings. Each of the settings for the modes and features having multiple registers may be associated with a respective frequency set point. Thus, several modes and features may be switched from one setting to another to change frequency set point by instructing the semiconductor device to switch from one of the registers for the several modes and features to another one of the registers for the several modes and features. For example, the bank architecture for the memory array may be switched by changing the frequency set point, that is, switching from the bank architecture from one setting to another by switching between the multiple registers in the mode register for the bank architecture setting. Additional or alternative modes and features may also be switched by changing the frequency set point.

The command/address terminals CA may further be supplied with an address. The address typically includes several bits of address information. The address supplied to the command/address terminals CA are transferred, via a command/address input circuit 205, to an address decoder 212. The address decoder 212 receives the address and supplies a decoded row address signal XADD to the row decoder 240, a decoded column address signal YADD to the column decoder 245, and supplies a decoded bank address signal BADD to the row decoder 240 and the column decoder 245. The decoded row address signal XADD, the decoded column address signal YADD, and the decoded bank address signal BADD may include one or more signals. The address decoder 212, row decoder 240, and/or column decoder 245 may include address decoding logic 216 that maps addresses to the memory array based on the bank architecture that is set in the mode register 225. For example, bits of the address provided to the command/address terminals CA may be decoded and mapped by the address decoder 212 to access banks of the memory array in different logical groupings based on the bank architecture set for the memory array.

When a read command is issued and a row address and a column address are timely supplied with the read command, read data is read from a memory cell in the memory array 250 designated by the row address and column address. The read command is received by the command decoder 215, which provides internal commands to input/output circuit 260 so that read data is output to outside from the data terminals DQ via read write amplifiers 255 and the input/output circuit 260 according to the RDQS clocks provided by the semiconductor device 200. As previously described, the read data is provided at a time defined by read latency information RL that may be programmed in the semiconductor device 200, for example, in a mode register 225. The read latency information RL may be defined in terms of clock cycles of the CK clock. For example, the read latency information RL may be a number of clock cycles of the CK clock after the read command is received when the associated read data is provided by the semiconductor device 200.

When a write command is issued and a row address and a column address are timely supplied with this command, then write data is supplied to the data terminals DQ according to the WCK and WCKF clocks received by the semiconductor device 200. The write command is received by the command decoder 215, which provides internal commands to the input/output circuit 260 so that the write data is received by data receivers in the input/output circuit 260, and supplied via the input/output circuit 260 and the read/write amplifiers 255 to the memory array 250. The write data is written in the memory cell designated by the row address and the column address. As previously described, the write data is provided to the data terminals DQ at a time that is defined by write latency WL information. The write latency WL information may be programmed in the semiconductor device 200, for example, in the mode register 225. The write latency WL information may be defined in terms of clock cycles of the CK clock. For example, the write latency information WL may be a number of clock cycles of the CK clock after the write command is received by the semiconductor device 200 when the associated write data is provided to the data terminals DQ.

The clock terminals and data clock terminals are supplied with external clocks. The external clocks CK, CKF, WCK, WCKF may be supplied to a clock input circuit 220. The CK and CKF clocks may be complementary and the WCK and WCKF clocks may be complementary. When enabled, input buffers included in the clock input circuit 220 receive the external clocks. For example, an input buffer receives the CK and CKF clocks when enabled by a CKE signal from the command decoder 215 and an input buffer receives the WCK and WCKF clocks when enabled by a WCKIBEN signal from the command decoder 215. The clock input circuit 220 may receive the external clocks and generate internal clocks ICK and IWCK and IWCKF. The internal clocks ICK and IWCK and IWCKF are supplied to internal clock circuits 230.

The internal clock circuits 230 includes circuits that provide various phase and frequency controlled internal docks based on the received internal clocks. For example, the internal clock circuits 230 may include a data clock path that receives the IWCK and IWCKF clocks and provides multiphase clocks IWCKn based on the internal clocks IWCK and IWCKF. The multiphase clocks IWCKn may be provided to the input/output circuit 260 for controlling an output timing of read data and the input timing of write data. The input/output circuit 160 may include clock circuits and driver circuits for generating and providing the RDQS clock.

The power supply terminals are supplied with power supply potentials VDD and VSS. These power supply potentials VDD and VSS are supplied to an internal voltage generator circuit 270. The internal voltage generator circuit 270 generates various internal potentials VPP, VOD, VARY, VPERI, and the like, and generates a reference potential ZQVREF based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks. The reference potential ZQVREF is used in the ZQ calibration circuit 265.

The power supply terminal is also supplied with power supply potential VDDQ. The power supply potential VDDQ is supplied to the input/output circuit 260 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. The dedicated power supply potential VDDQ is used for the input/output circuit 260 so that power supply noise generated by the input/output circuit 260 does not propagate to the other circuit blocks.

The calibration terminal ZQ is connected to the ZQ calibration circuit 265. The ZQ calibration circuit 265 performs a calibration operation with reference to an impedance of RZQ, and the reference potential ZQVREF, when activated by the ZQ calibration command ZQ_com. An impedance code ZQCODE obtained by the calibration operation is supplied to the input/output circuit 260, and thus an impedance of an output buffer (not shown) included in the input/output circuit 260 is specified.

Figure 3:
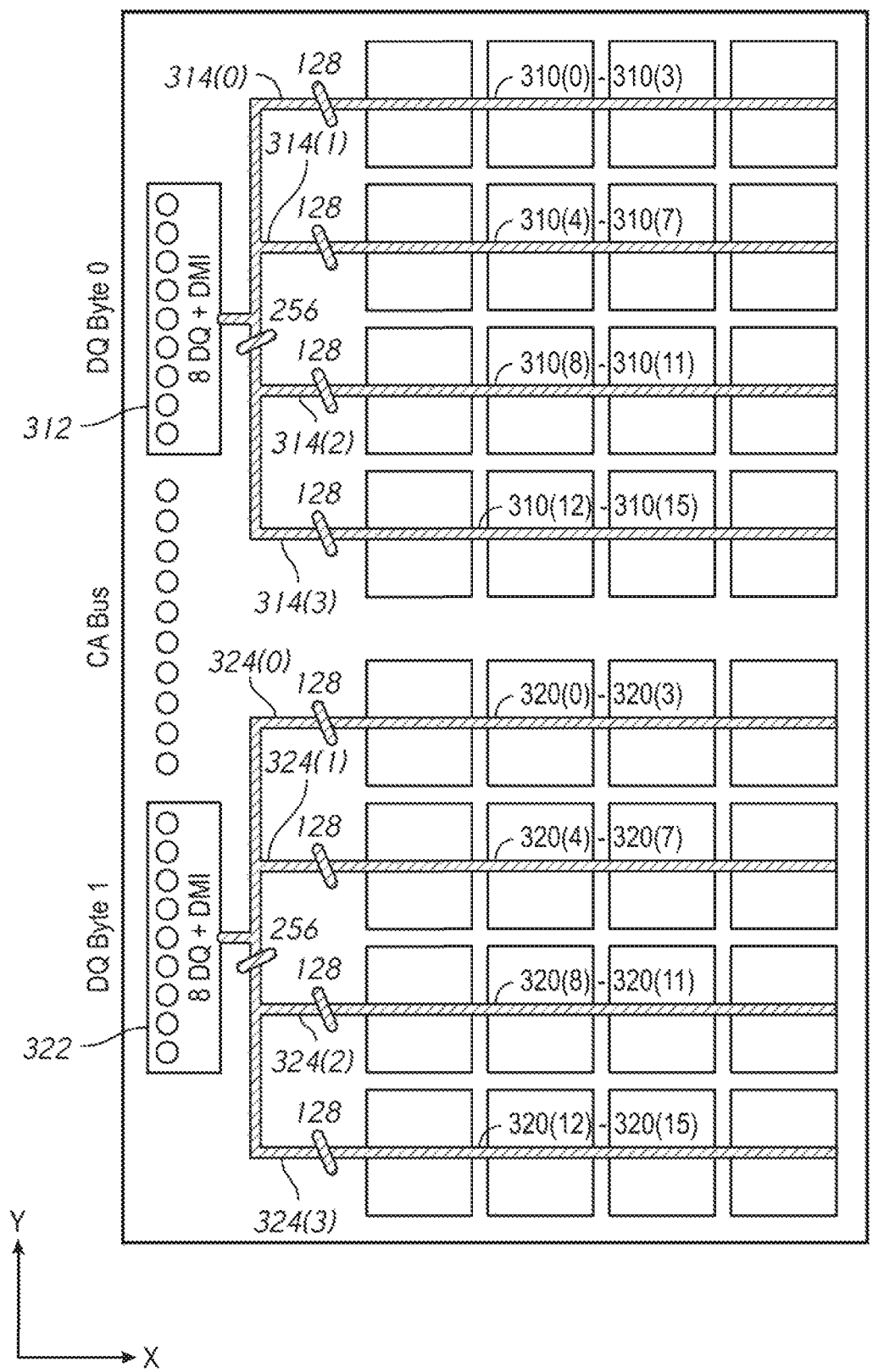
FIG. 3 is a block diagram of a portion of a semiconductor device according to an embodiment of the disclosure.

FIG. 3 is a block diagram of a portion of a semiconductor device according to an embodiment of the disclosure. The portion of the semiconductor device of FIG. 3 may be included in the memory array 250 of the semiconductor device 200 of FIG. 2.

With reference to FIG. 3, the semiconductor device includes a memory array including a plurality of physical memory banks 310(0)-310(15) and 320(0)-320(15) and data paths 312 and 322. The memory banks 310(0)-310(15) may represent a first half-bank of a memory array and the memory banks 320(0)-320(15) may represent a second half-bank of the memory array.

Each of the memory banks 310(0)-310(15) and 320(0)-320(15) include memory cells that store data. The memory cells may be arranged in the respective memory banks 310(0)-310(15) and 320(0)-320(15) as previously described with reference to the semiconductor device 200 of FIG. 2, such as, in rows and columns of memory. For example, each of the memory banks 310(0)-310(15) and 320(0)-320(15) includes memory cells that are arranged along rows, where each row extends along a y-direction. The memory cells are further arranged along columns, where each column extends along an x-direction. The memory cells along each row of a memory bank may define a respective page of memory, with the width of the page of memory corresponding to the number of memory cells arranged per row. For example, in some embodiments of the disclosure, each row of memory cells of the memory banks 310(0)-310(15) and 320(0)-320(15) includes 8,192 memory cells to store 8,192 bits of data (1-bit stored per memory cell), which results in memory pages of 8,192-bits (equivalently, memory pages of 1,024-bytes, each byte having 8-bits).

The data paths 312 and 322 include circuits and data lines for providing data to and from the external terminals DQ. The data paths 312 and 322 may include circuits and data lines as previously described with reference to the semiconductor device 200 of FIG. 2, in some embodiments of the disclosure. For example, the data paths 312 and 322 may include read/write amplifiers 255 and the input/output circuit 260 previously described with reference to FIG. 2.

In some embodiments of the disclosure, each of the data paths 312 and 322 provide data to and from eight external terminals DQ. The data path 312 may represent a first byte 0 and the data path 322 may represent a second byte 1. Further, in some embodiments of the disclosure, the data paths 312 and 322 include circuits and signal lines for multi-use external terminals DMI, which may be used for various operational signals, for example, data mask, data bit inversion, parity, etc., that are provided with the respective data at the external terminals DQ.

Data is transferred between the memory banks 310(0)-310(15) and the data path 312 on data input/output (IO) busses 314(0)-314(3), and likewise, data is transferred between the memory banks 320(0)-320(15) and the data path 322 through data IO busses 324(0)-324(3). For example, data is transferred between the memory banks 310(0)-310(3) and the data path 312 on data IO bus 314(0), data is transferred between the memory banks 310(4)-310(7) and the data path 312 on data IO bus 314(1), data is transferred between the memory banks 310(8)-310(11) and the data path 312 on data IO bus 314(2), and data is transferred between the memory banks 310(12)-310(15) and the data path 312 on data IO bus 314(3). Similarly, data is transferred between the memory banks 320(0)-320(3) and the data path 322 on data IO bus 324(0), data is transferred between the memory banks 320(4)-320(7) and the data path 322 on data IO bus 324(1), data is transferred between the memory banks 320(8)-320(11) and the data path 322 on data IO bus 324(2), and data is transferred between the memory banks 320(12)-320(15) and the data path 322 on data IO bus 324(3). The data IO busses 314(0)-314(3) and 324(0)-324(3) may extend along a direction corresponding to a direction along which the columns of memory cells extend in some embodiments of the disclosure (e.g., along the x-direction).

When a memory bank of the memory banks 310(0)-310(15) and 320(0)-320(15) is accessed, such as to provide data to the respective data path for a read operation or to receive data from the respective data path for a write operation, the number of bits of data transferred from or to the accessed memory bank at a time may correspond to a data width of the respective data IO bus. The data paths 312 and 322 each may concurrently transfer the data for one or more data IO busses. For example, in some embodiments of the disclosure, each data path 312 and 322 may concurrently transfer data for up to two data IO busses. Data from less than two data IO busses may be transferred through the data paths 312 and 322 as well. The data paths 312 and 322 each transfer data to and from respective external terminals DQ. A DQ width of the external terminals DQ is typically less than the data width of the data paths 312 and 322, and also less than the data width of each of the data IO busses 314(0)-314(3) and 324(0)-324(3). The data width of the data paths 312 and 322 may be a multiple of the DQ width. Similarly, the data width of the data IO busses 314(0)-314(3) and 324(0)-324(3) may be a multiple of the DQ width.

In some embodiments of the disclosure, the data IO busses 314(0)-314(3) and 324(0)-324(3) each have a data width of 128-bits, and the data paths 312 and 322 each have a data width of 256-bits. The data paths 312 and 322 may concurrently transfer data from up to two of the data IO busses 314(0)-314(3) and 324(0)-324(3), that is, up to 256-bits. Data from less than a full 256-bits may be transferred through the data paths 312 and 322 as well (e.g., transfer 128-bits). In some embodiments of the disclosure, the DQ width of the external terminals DQ is 8-bits (e.g., one-byte; 8 external terminals DQ). As previously described, some embodiments of the disclosure also include a multi-use external terminal DMI.

The semiconductor device may further include external terminals CA for receiving, for example, memory commands and memory addresses from a command/address bus. The external terminals CA, may be as previously described with reference to the semiconductor device 200 of FIG. 2.

As will be described in more detail below, the memory banks 310(0)-310(15) and 320(0)-320(15) may be arranged into various bank architectures. In some embodiments, for example, mobile systems which have a need to operate across a wide range of frequencies and power profiles, including semiconductor devices as disclosed may allow operation of the system with different architectures under different conditions to optimize power and performance. The different bank architectures may provide different preferred access methods for various system configurations. For example, one of the bank architectures may be a bank group configuration (referenced as "bank group" or "bank group mode" configuration) that arranges the memory banks 310(0)-310(15) and 320(0)-320(15) into banks, and the banks are grouped into bank groups, where each bank group includes one or more of the memory banks 310(0)-310(15) and/or one or more of the memory banks 320(0)-320(15). An example bank architecture with a bank group mode configuration arranges the memory banks 3100)-310(15) and 320(0)-320(15) into 4 banks, and 4 bank groups. Each of the 4 bank groups includes memory banks associated with each of the 4 banks, and each bank corresponds to memory banks from memory banks 310(0)-310(15) and memory banks from memory banks 320(0)-320(15). Other examples of bank group mode configurations may include different arrangements of banks and bank groups without departing from the scope of the disclosure. For example, in some embodiments of the disclosure, the bank group mode configuration includes an arrangement of 4 banks, and 8 bank groups. In some embodiments of the disclosure, the bank group mode configuration includes an arrangement of 2 banks, and 8 bank groups. More generally, other embodiments of the disclosure include bank group mode configurations with still different arrangements of banks and bank groups.

Other examples of bank architectures may not have bank groups, but have the memory banks 310(0)-310(15) and 320(0)-320(15) arranged into banks, each bank having more than one of the memory banks 310(0)-310(15) and/or more than one of the memory banks 320(0)-320(15). For example, one non-bank group bank architecture arranges the memory banks 310(0)-310(15) and 320(0)-320(15) into 8 banks, with each bank having four memory banks from the memory banks 310(0)-310(15) and/or 320(0)-320(15) (referenced as 8 "bank" mode configuration). Another non-bank group bank architecture arranges the memory banks 310(0)-310(15) and 320(0)-320(15) into 16 banks, with each bank having two memory banks from the memory banks 310(0)-310(15) and/or 320(0)-320(15) (referenced as 16 "bank" mode configuration). Other examples may include different arrangements of banks without departing from the scope of the disclosure. For example, in some embodiments of the disclosure, the memory banks 310(0)-310(15) and 320(0)-320(15) are arranged into 32 banks. More generally, other embodiments of the disclosure include non-bank group mode configurations with still different arrangements of banks.

Additionally, operation during an access operation (e.g., read and write operations) may be based at least in part on the bank architecture for the memory banks. For example, the amount of data for data prefetch, that is, the amount of data provided by the memory banks to the data paths 312 and 322 for an access operation, may depend at least in part on the bank architecture of the memory banks. The amount of data for data prefetch may affect burst length options for access operations. In some embodiments of the disclosure, a bank architecture with a bank group mode configuration that arranges the memory banks 310(0)-310(15) and 320(0)-320(15) into 4 banks, and 4 bank groups includes burst lengths of 16-bits and 32-bits. In some embodiments of the disclosure, a bank architecture with a bank mode configuration that arranges the memos banks 310(0)-310(15) and 320(0)-320(15) into 8 banks includes a burst length of 32-bits. In some embodiments of the disclosure, a bank architecture with a bank mode configuration that arranges the memory banks 310(0)-310(15) and 320(0)-320(15) into 16 banks includes burst lengths of 16-bits and of 32-bits.

Another example of operation during an access operation that depends on the bank architecture for the memory banks is related to the timing of data provided from and received by the external terminals DQ. For example, with regards to a read operation, the may be provided from the external terminals DQ in separate bit groups separated by a time gap for a bank architecture with a bank group mode configuration.

In another example, with regards to consecutive read operations to the same bank group, data may be provided from the external terminals DQ for the first read operation and the second read operation with a time gap in between for a bank architecture with a bank group mode configuration. In another example, with regards to consecutive read operations to the same bank group, data may be provided from the external terminals DQ for the first read operation and the second read operation consecutively without a time gap in between for a bank architecture with a bank mode configuration.

Another example of operation during an access operation that depends on the bank architecture for the memory banks is related to the timing of access commands to access a same bank group or different bank group, and timing of access command to access a same bank or different bank.

In accessing the different bank architectures, circuits of a semiconductor device may provide internal signals and decoded addresses based on the bank architecture set, for example, by information stored in a mode register. For example, as previously described with reference to the semiconductor device 200 of FIG. 2, the command decoder 215 may provide internal signals to control the circuits of the semiconductor device 200 to access the memory array 250 as arranged according to the bank architecture that is set by the information stored in the mode register 225 for the modes related to bank architecture. Additionally, for example, address decoding logic 216 that may be included in the address decoder 212, row decoder 240, and/or column decoder 245 is used to map addresses to the memory array 250 based on the bank architecture that is set in the mode register 225, such as bits of the address provided to the command/address terminals CA decoded and mapped to access banks of the memory array in different logical groupings based on the bank architecture set for the memory array 250.

Figure 4:
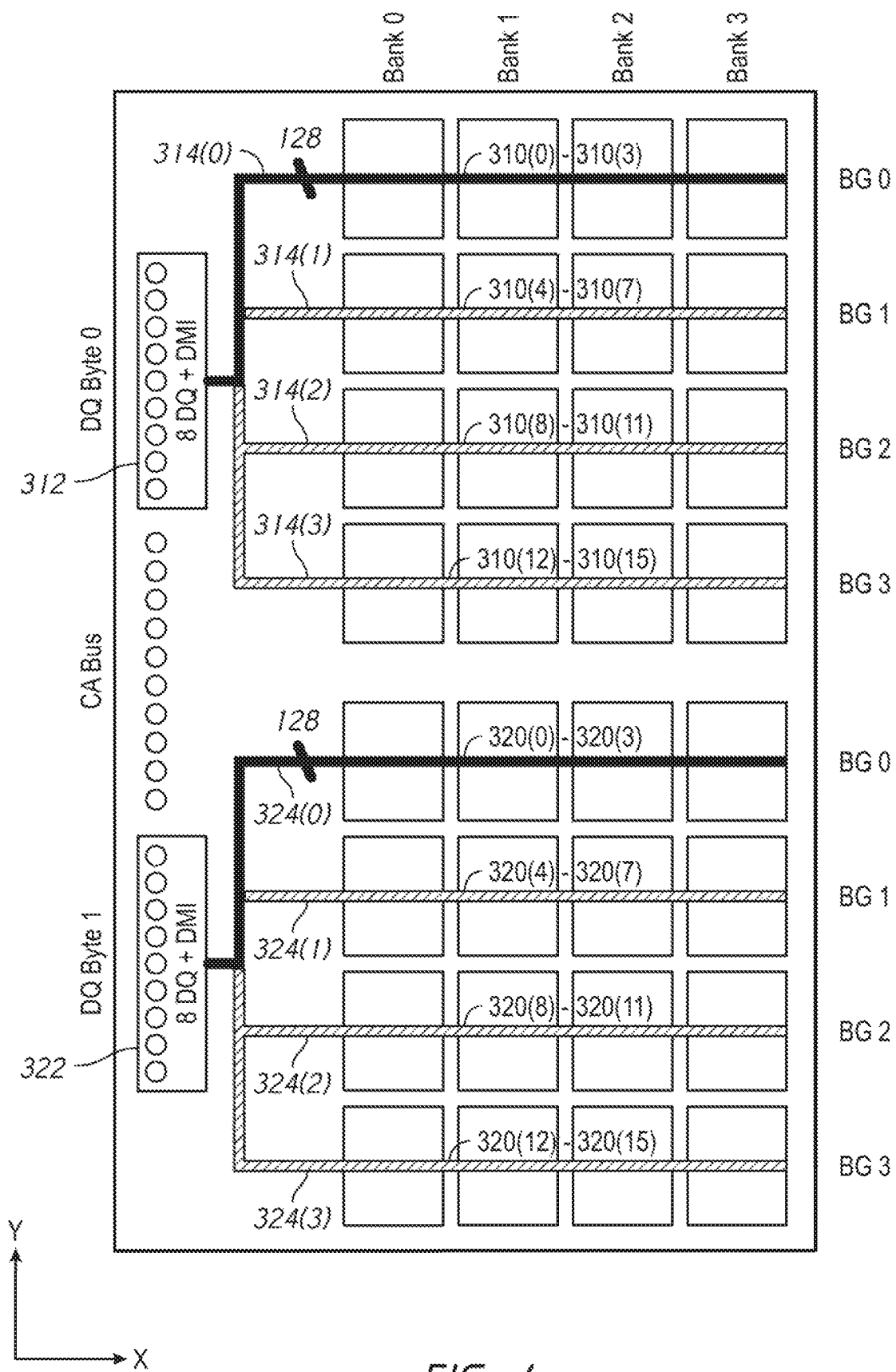
FIG. 4 is a block diagram of the portion of the semiconductor device of FIG. 3 arranged in a bank architecture according to an embodiment of the disclosure.

FIG. 4 is a block diagram of the portion of the semiconductor device of FIG. 3 arranged is a bank architecture according to an embodiment of the disclosure.

The bank architecture shown in FIG. 4 is a bank group mode configuration according to an embodiment of the disclosure. The memory banks 310(0)-310(15) and 320(0)-320(15) are arranged into banks, and the banks are grouped into multiple bank groups, where each bank group includes one or more of the memory banks 310(0)-310(15) and/or one or more of the memory banks 320(0)-320(15). In the particular example of FIG. 4, the memory banks 310(0)-310(15) and 320(0)-320(15) are arranged into 4 banks, and 4 bank groups. Each of the 4 bank groups includes memory banks associated with each of the 4 banks, and each bank corresponds to memory banks from memory banks 310(0)-310(15) and memory banks from memory banks 320(0)-320(15). For example, Bank Group 0 (BG0) includes memory banks 310(0)-310(3) and 320(0)-320(3) associated with Banks 0 through 3; Bank Group 1 (BG1) includes memory banks 310(4)-310(7) and 320(4)-320(7) associated with Banks 0 through 3; Bank Group 2 (BG2) includes memory banks 310(8)-310(11) and 320(8)-320(11) associated with Banks 0 through 3; and Bank Group 3 (BG3) includes memory banks 310(12)-310(15) and 320(12)-320(15) associated with Banks 0 through 3.

Other embodiments of the disclosure may have the banks, bank groups, and/or memory banks of the bank group arranged in a different manner than previously described with reference to FIG. 4. For example, the memory banks may be arranged in a bank architecture with a bank group mode configuration having greater or fewer number of banks and/or bank groups and/or memory banks per bank group, as well as a different arrangement of banks and/or bank groups and/or memory banks per bank group. More generally, the scope of the disclosure is not limited to the particular example previously described with reference to FIG. 4.

In operation, data may be transferred to and from the Bank Groups 0 through 3. When a bank group is accessed, data is transferred between the memory banks of the accessed bank group and the data paths 312 and 322 on the respective data IO bus. Typically, full data widths of data are transferred on the respective data IO busses between memory banks 310 and the data path 312 and between memory banks 320 and the data path 322 when a bank group is accessed. For example, in an embodiment where the data widths of the data IO busses 314(0)-314(3) and 324(0)-324(3) are 128-bits, when a bank group is accessed, 128-bits of data are transferred on the respective data IO bus 314 between the memory banks 310 of the accessed bank group and the data path 312 and 128-bits of data are transferred on the respective data IO bus 324 between the memory banks 320 of the accessed bank group and the data path 322. A total of 256-bits (e.g., 2×128-bits) are transferred when a bank group is accessed.

Figure 5:
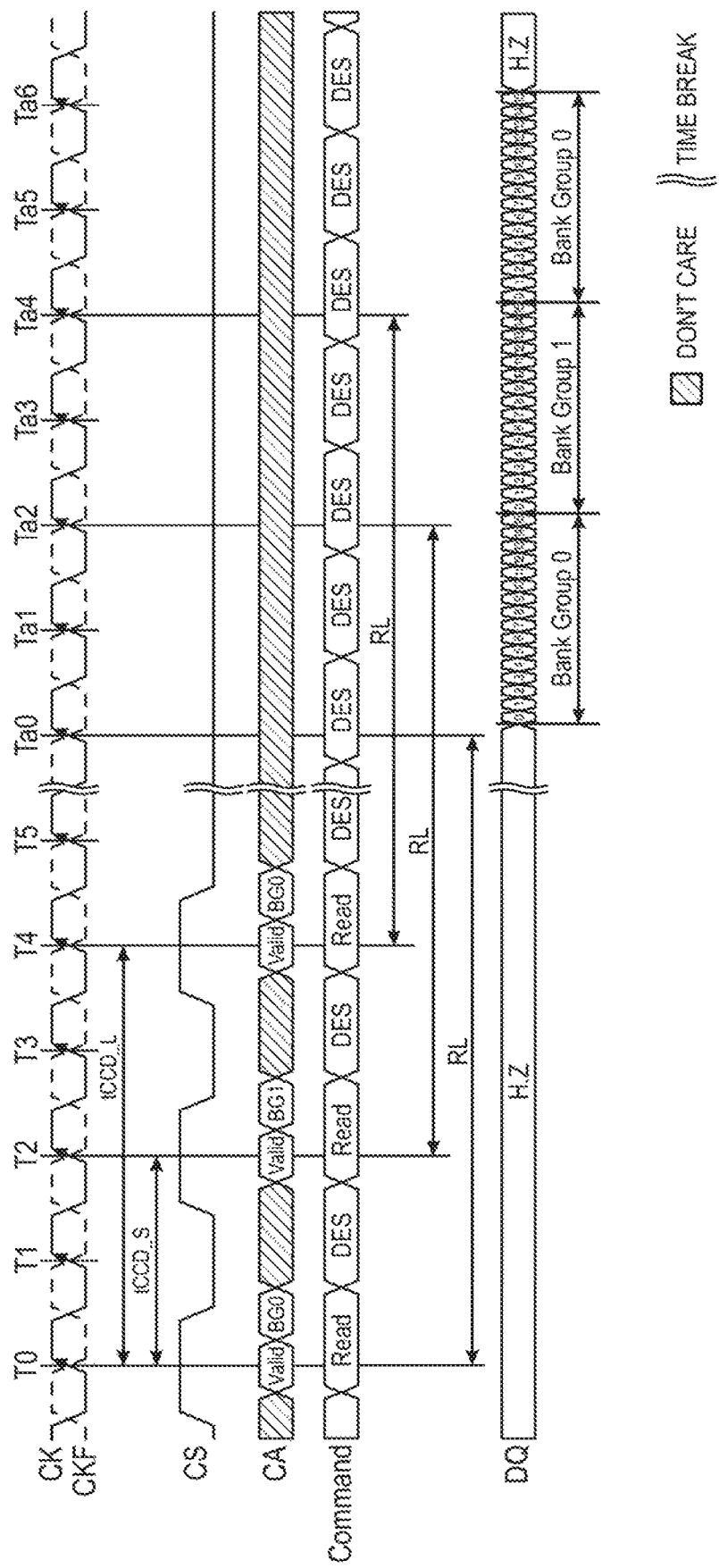
FIG. 5 is a timing diagram of various signals during operation of the semiconductor device of FIG. 3 arranged in a bank architecture with a bank group mode configuration according to an embodiment of the disclosure.
Figure 6:
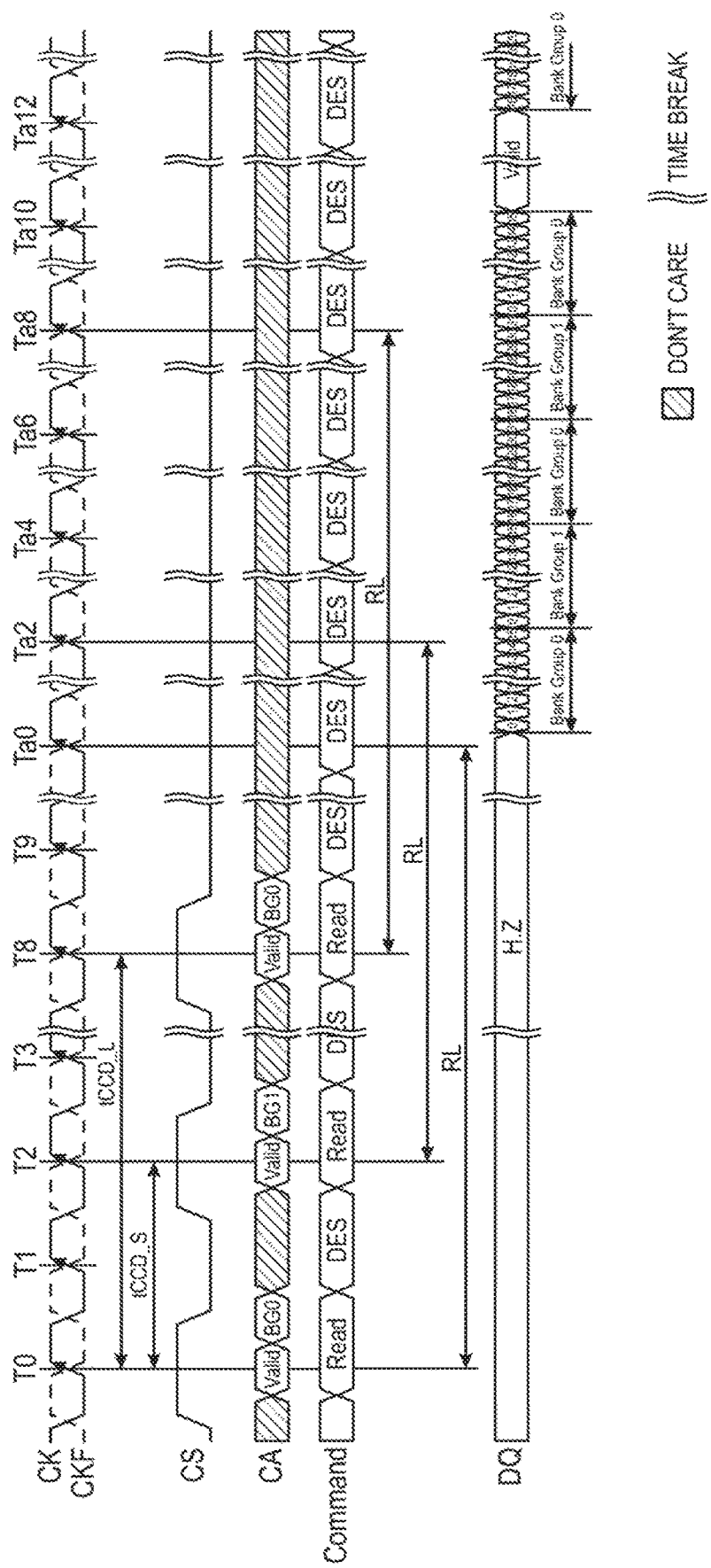
FIG. 6 is a timing diagram of various signals during operation of the semiconductor device of FIG. 3 arranged in a bank architecture with a bank group mode configuration according to an embodiment of the disclosure.

The data may be provided to and from the data paths on the external terminals DQ in different burst lengths based on the mode settings programmed (e.g., in a mode register for the operands associated with burst length). Example access operations to the bank groups will be described with reference to FIGS. 5 and 6. FIG. 5 is a timing diagram of various signals during operation of the semiconductor device of FIG. 3 arranged in a bank architecture with a bank group mode configuration having a 16-bit burst length according to an embodiment of the disclosure. FIG. 6 is a timing diagram of various signals during operation of the semiconductor device of FIG. 3 arranged in a bank architecture with a bank group mode configuration having a 32-bit burst length according to an embodiment of the disclosure. In some embodiments of the disclosure, the bank group mode configuration for the example operations of FIGS. 5 and 6 may be as previously described with reference to FIG. 4.

FIG. 5 illustrates an example access operation for reading data front two bank groups. The two bank groups are accessed in an interleaved manner, with data provided from a first bank group, followed by a second bank group, and then followed by the first bank group, and so on. In the example access operation, the memory banks are arranged in a bank architecture with a bank group mode configuration of 4 banks and 4 bank groups. Additionally, the ratio CKR between a data strobe clock WCK and an external clock CK is 4:1, and a burst length for the read data is 16. A latency RL is set so that data is provided at a time RL following a corresponding read command. The latency RL may be defined by a number clock cycles of the CK clock as previously described.

The bank architecture may be set by programming appropriate values in a mode register for operands that correspond to a bank architecture setting. The CKR may be set by programming appropriate values in a mode register for operands that correspond to WCK to CK setting. The burst length may be set by programming appropriate values in a mode register for operands that correspond to a burst length setting. The latency RL may be set by programming appropriate values in a mode register for operands that correspond to a RL latency setting.

With the CKR 4:1, the WCK clock has four-times the frequency of the CK clock, which in other words means there are four clock cycles of the WCK clock during one clock cycle of the CK clock. While not shown in FIG. 5, the WCK is active during provision of data and has four times the clock frequency of the CK clock. As previously described, data is provided from each external terminal DQ, with one-bit of data provided at each rising and falling clock edge of the WCK clock. Assuming 8 external terminals DQ per data path 312 and 322, and having a burst length of 16, 32 bytes of data (8-bits per byte) are provided by a bank group for a memory access operation (16 bytes of data from data path 312 for a first half-bank and 16 bytes of data from data path 322 for a second half-bank).

Prior to time T0, and not shown in FIG. 5, an activation command and associated memory addresses have been received by the semiconductor device. For example, in some embodiments of the disclosure, an Activate command with row memory addresses are received prior to time T0. Additionally, prior to time T0, a select signal CS becomes active (e.g., active when the CS signal is a high logic level) to select the semiconductor device. A memory access command and associated memory addresses are also provided to the semiconductor device. When selected by the active CS signal, the semiconductor device receives the memory command and memory addresses responsive to the CK clock (and the complementary CKF clock). For example, at time T0 and a subsequent falling clock edge of the CK clock, the selected semiconductor device receives a Read command ("Valid") and associated memory address including bank group address BG0 (the bank group address for Bank Group 0). As a result of the Read command and BG0 address, data will be read from the memory address in Bank Group 0. Data for the Read command of time T0 is provided at a time Ta0 that is RL following receipt of the Read command and associated memory addresses at time T0. 16-bits of data are provided from each of the external terminals DQ following time Ta0.

Prior to time T2, the CS signal becomes active again to select the semiconductor device, and a second memory command and associated memory addresses are provided to the semiconductor device. The semiconductor device receives the second memory command and associated memory addresses at time T2 and a subsequent falling clock edge of the CK clock. In particular, the semiconductor device receives a second Read command, as well as the memory address including bank group address BG1 (the bank group address for Bank Group 1). As a result of the second Read command and BG1 address, data will be read from the memory address in Bank Group 1. Data for the second Read command of time T2 is provided at a time Ta2 that is RL following receipt of the second Read command and associated memory addresses at time T2. 16-bits of data are provided from each of the external terminals DQ following time Ta2.

Prior to time T4, the CS signal becomes active again to select the semiconductor device, and a third memory command and associated memory addresses are provided to the semiconductor device. The semiconductor device receives the third memory command and associated memory addresses at time T4 and a subsequent falling clock edge of the CK clock. In particular, the semiconductor device receives a third Read command, as well as the memory address including bank group address BG0. The third Read command represents a second read operation to Bank Group 0. Due to the third Read command and BG0 address, data will be read from the memory address in Bank Group 0. Data for the third Read command of time T4 is provided at a time Ta4 that is RL following receipt of the third Read command and associated memory addresses at time T4. 16-bits of data are provided from each of the external terminals DQ following time Ta4.

Deselect commands DES are shown in FIG. 5 in between the access commands. However, the DES commands are provided by way of example, and other commands may be provided during those times. Additionally, different, additional, and/or alternative address information to that shown in FIG. 5 for a memory command may be provided.

As illustrated by the example access operation of FIG. 5, access to different bank groups may be interleaved. Interleaving access to different bank groups may prevent idle time on the external terminals DQ that may occur when accessing only one bank group. The idle time may result from a minimum timing of tCCD_L between access operations to a same bank group. That is, a second access command to a bank group may not be provided any sooner than tCCD_L after a first access command to the same bank group. The tCCD_L time is shown in FIG. 5 between times T0 and T4. Thus, the second Read command for the Bank Group 0 (at time T4) should not be provided sooner than tCCD_L following the first Read command for the Bank Group 0 (at time T0). Due to the tCCD_L limitation for access operations to the same bank group, data read from the same bank group will be provided at times that leave the external terminals DQ idle. For example, assuming that the Read command at time T2 for Bank Group 1 was not provided, data for the second Read command at time T4 for Bank Group 0 is provided following a gap from the data for the first Read command at time T0 for Bank Group 0 and the external terminals DQ will be idle for the time following the $16^{th}$ bit of the first Read command to Bank Group 0 and the $1^{st}$ bit of the second Read command to Bank Group 0 (e.g., idle from about time Ta2 to about time Ta4, that is, for the time data from Bank Group 1 would have been provided).

However, in contrast to the minimum tCCD_L time for access commands for a same bank group, access commands for different bank groups have a shorter minimum time tCCD_S. The minimum time tCCD_S is shown in FIG. 5 between times T0 and T2. The shorter tCCD_S time may allow for an access command for a different bank group to be provided between access commands to a same bank group, thereby interleaving access operations. In FIG. 5, the Read command at time T2 to Bank Group 1 is provided between the Read commands at times T0 and T4 to Bank Group 0. The Read command for the Bank Group 1 results in data provided on the external terminals DQ during a time that would otherwise have been idle for consecutive access operations to Bank Group 0. As a result, the data bandwidth of the semiconductor device may be more efficiently utilized.

FIG. 6 illustrates an example access operation for reading data from two bank groups. The two bank groups are accessed in an interleaved manner, with data provided from a first bank group, followed by a second bank group, and then followed by the first bank group, and so on. In the example access operation, the memory banks are arranged in a bank architecture with a bank group mode configuration of 4 banks and 4 bank groups as previously described with reference to FIG. 5. Additionally, various operating conditions for the semiconductor device is also as previously described for the example of FIG. 5 (e.g., CKR of 4:1), except that the burst length for the read data is 32 and the RL may be greater for the example of FIG. 6. Assuming 8 external terminals DQ per data path 312 and 322, and having a burst length of 32, 64 bytes of data are provided by a bank group for a memory access operation (32 bytes of data from data path 312 for a first half-bank and 32 bytes of data from data path 322 for a second half-bank).

Prior to time T0, and not shown in FIG. 6, an activation command and associated memory addresses have been received by the semiconductor device. For example, in some embodiments of the disclosure, an Activate command with row memory addresses are received prior to time T0. Additionally, prior to time T0, a select signal CS becomes active to select the semiconductor device. A memory access command and associated memory addresses are also provided to the semiconductor device. At time T0 and a subsequent falling clock edge of the CK clock, the selected semiconductor device receives a Read command ("Valid") and associated, memory addresses including bank group address BG0. As a result of the Read command and BG0 address, data will be read from the memory address in Bank Group 0. A first group of data for the Read command of time T0 is provided at time Ta0 that is RL following receipt of the Read command and associated memory addresses at time T0, and a second group of data for the Read command of time T0 is provided following a gap from the end of the first group of data. For example, 32-bits of data are provided from each of the external terminals DQ due to the burst length of 32-bits. For the Read command at time T0, the 32-bits are separated into two groups of 16-bits per group. The first 16-bit group of data is provided at about time Ta0, which is RL following the Read command at time T0, and the second 16-bit group of data is provided after a gap of 8 clock cycles of the WCK clock (tWCK) following the end of the first 16-bit group of data (e.g., provided at about time Ta4).

Prior to time T2, the CS signal becomes active again to select the semiconductor device, and a second memory command and associated memory addresses are provided to the semiconductor device. The semiconductor device receives the second memory command and associated memory addresses at time T2 and a subsequent falling clock edge of the CK clock. In particular, the semiconductor device receives a second Read command, as well as the memory address including bank group address BG1. As a result of the second Read command and BG1 address, data will be read from the memory address in Bank Group 1. A first group of data for the Read command of time T2 is provided at a time Ta2 that is RL following receipt of the Read command and associated memory addresses at time T2, and a second group of data for the Read command of time T2 is provided following a gap from the end of the first group of data. 32-bits of data are provided from each of the external terminals DQ, with the 32-bits are separated into two groups of 16-bits per group. For the Read command at time T2, the first 16-bit group of data is provided at about time Ta2, which is RL following the Read command at time T2, and the second 16-bit group of data is provided after a gap of 8 tWCK following the end of the first 16-bit group of data (e.g., provided at about time Ta6).

Prior to time T8, the CS signal becomes active again to select the semiconductor device, and a third memory command and associated memory addresses are provided to the semiconductor device. The semiconductor device receives the third memory command and associated memory addresses at time T8 and a subsequent falling clock edge of the CK clock. The semiconductor device receives a third Read command, as well as the memory address including bank group address BG0. The third Read command represents a second read operation to bank group 0. In response to the third Read command and BG0 address, data will be read from the memory address in Bank Group 0. A first group of data for the Read command of time T8 is provided at time Ta8 that is RL following receipt of the Read command and associated memory addresses at time T8, and a second group of data for the Read command of time T8 is provided following a gap from the end of the first group of data. For the Read command at time T8, a first 16-bit group of data is provided at about time Ta8, which is RL following the Read command at time T8, and the second 16-bit group of data is provided after a gap of 8 tWCK following the end of the first 16-bit group of data (e.g., provided at about time Ta12).

Deselect commands DES are shown in FIG. 6 in between the access commands. However, the DES commands are provided by way of example, and other commands may be provided during those times. Additionally, different, additional, and/or alternative address information to that shown in FIG. 6 for a memory command may be provided.

Similar to the example access operation of FIG. 5, FIG. 6 illustrates an example access operation with access to different bank groups interleaved, which as previously described, may prevent idle time on the external terminals DQ that may occur when accessing only one bank group. However, in contrast to the example access operation of FIG. 5, the example access operation of FIG. 6 has a 32-bit burst length. As previously described, the 32-bits for an access operation are separated into two 16-bit groups provided with an 8 tWCK gap. Interleaving the access operations results, in interleaving the two groups of 16-bits for the access operations for the two different bank groups. However, access operations to a same bank group for a 32-bit burst length may result in more idle time compared to a 16-bit burst length.

Compared to the example of FIG. 5, the minimum timing of tCCD_L between access operations to a same bank group is longer for the example access operation of FIG. 6, which is due to the longer 32-bit burst length. The tCCD_L time is shown in FIG. 6 between times T0 and T8. Thus, the second Read command for the Bank Group 0 (at time T4) should not be provided sooner than tCCD_L following the first Read command for the Bank Group 0 (at time T0). Due to the tCCD_L limitation for access operations to the same bank group, data read from the same bank group will be provided a time that leaves the external terminals DQ idle.

With reference to FIG. 6, assuming that the Read command at time T2 for bank group 1 was not provided, the external terminals DQ will be idle for the time between the $16^{th}$ bit of the first 16-bit group of data for the first Read command to Bank Group 0 and the $1^{st}$ bit of the second group of data for the first Read command to Bank Group 0, and also for the time between the 16$^{th}$ bit of the first 16-bit group of data for the second Read command to Bank Group 0 and the 1$^{st}$ bit of the second group of data for the second Read command to Bank Group 0 (e.g., idle from about time Ta2 to about time Ta4, and idle from about time Ta6 to about time Ta8 and from about time Ta10 to about time Ta12).

However, as previously described, the minimum time tCCD_S for access commands for different hank groups are shorter than tCCD_L. The minimum time tCCD_S is shown in FIG. 6 between times T0 and T2. The shorter tCCD_S time may allow for an access command for a different bank group to be provided between access commands to a same bank group, thereby interleaving access operations. In FIG. 6, the Read command at time T2 to Bank Group 1 is provided between the Read commands at times T0 and T8 to Bank Group 0. The Read command for the Bank Group 1 results in data provided on the external terminals DQ during a time that would otherwise have been idle for consecutive access operations to Bank Group 0. As a result, the data bandwidth of the semiconductor device may be more efficiently utilized.

Figure 7:
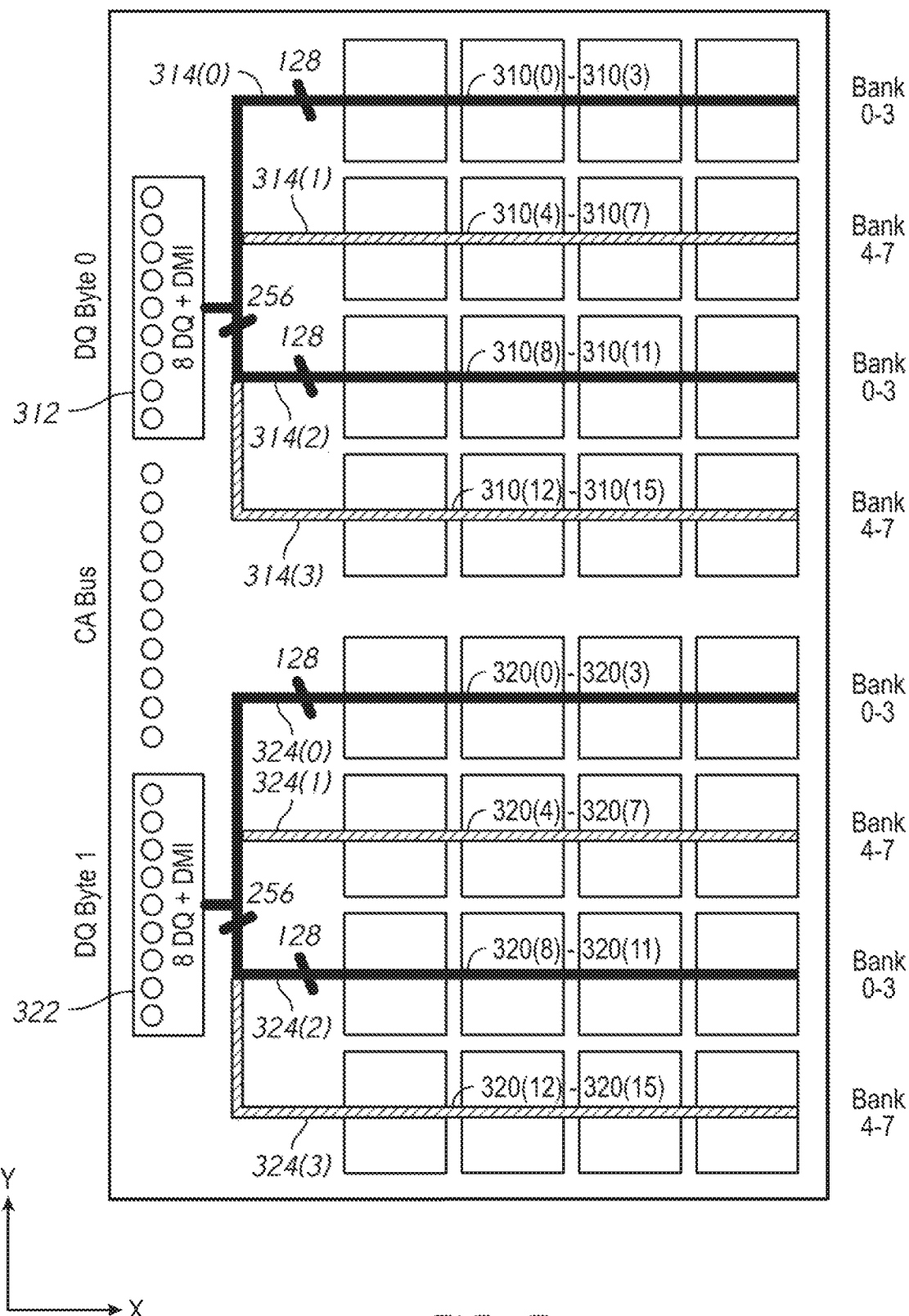
FIG. 7 is a block diagram of the portion of the semiconductor device of FIG. 3 arranged in a bank architecture according to an embodiment of the disclosure.

FIG. 7 is a block diagram of the portion of the semiconductor device of FIG. 3 arranged in a bank architecture according to an embodiment of the disclosure.

The bank architecture shown in FIG. 7 is a bank mode configuration according to an embodiment of the disclosure. The memory banks 310(0)-310(15) and 320(0)-320(15) are arranged into multiple banks, but without any bank groups, and each of the banks includes one or more of the memory banks 310(0)-310(15) and/or one or more of the memory banks 320(0)-320(15). In the particular example of FIG. 7, the memory banks 310(0)-310(15) and 320(0)-320(15) are arranged into 8 banks. Each of the 8 banks includes memory banks from memory banks 310(0)-310(15) and memory banks from memory banks 320(0)-320(15). For example, Bank 0 includes memory banks 310(0), 310(8), 320(0), and 320(8); Bank 1 includes memory banks 310(1), 310(9), 320(1), and 320(9); Bank 2 includes memory banks 310(2), 310(10), 320(2), and 320(10); Bank 3 includes memory banks 310(3), 310(11), 320(3), and 320(11); Bank 4 includes memory banks 310(4), 310(12), 320(4), and 320(12); Bank 5 includes memory banks 310(5), 310(13), 320(5), and 320(13); Bank 6 includes memory banks 310(6), 310(14), 320(6), and 320(14); and Bank 7 includes memory banks 310(7), 310(15), 320(7), and 320(15).

Other embodiments of the disclosure may have the banks and/or memory banks of the banks arranged in a different manner than previously described with reference to FIG. 7. For example, the memory banks may be arranged in a bank architecture with a bank mode configuration having greater or fewer number of banks and/or memory banks per bank, as well as a different arrangement of banks and/or memory banks per bank. More generally, the scope of the disclosure is not limited to the particular example previously described with reference to FIG. 7.

In operation, data may be transferred to and from the Banks 0 through 7. When a bank is accessed, data is transferred between the memory banks of the accessed bank and the data paths 312 and 322 on the respective data IO bus. Typically, full data widths of data are transferred on the respective data IO busses between memory banks 310 and the data path 312 and between memory banks 320 and the data path 322 when a bank is accessed. For example, in an embodiment where the data widths of the data IO busses 314(0)-314(3) and 324(0)-324(3) are 128-bits, when a bank is accessed, 128-bits of data are transferred on each of four data IO busses between the memory banks and the data paths: when accessing any of banks 0 through 3, 128-bits of data are transferred on the data IO bus 314(0), 128-bits of data are transferred on the data IO bus 314(2), 128-bits of data are transferred on the IO bus 324(0), and 128-bits of data are transferred on the IO bus 324(2); when accessing any of banks 4 through 7, 128-bits of data are transferred on the data IO bus 314(1), 128-bits of data are transferred on the data IO bus 314(3), 128-bits of data are transferred on the IO bus 324(1), and 128-bits of data are transferred on the IO bus 324(3). A total of 512-bits are transferred when a bank is accessed.

Figure 8:
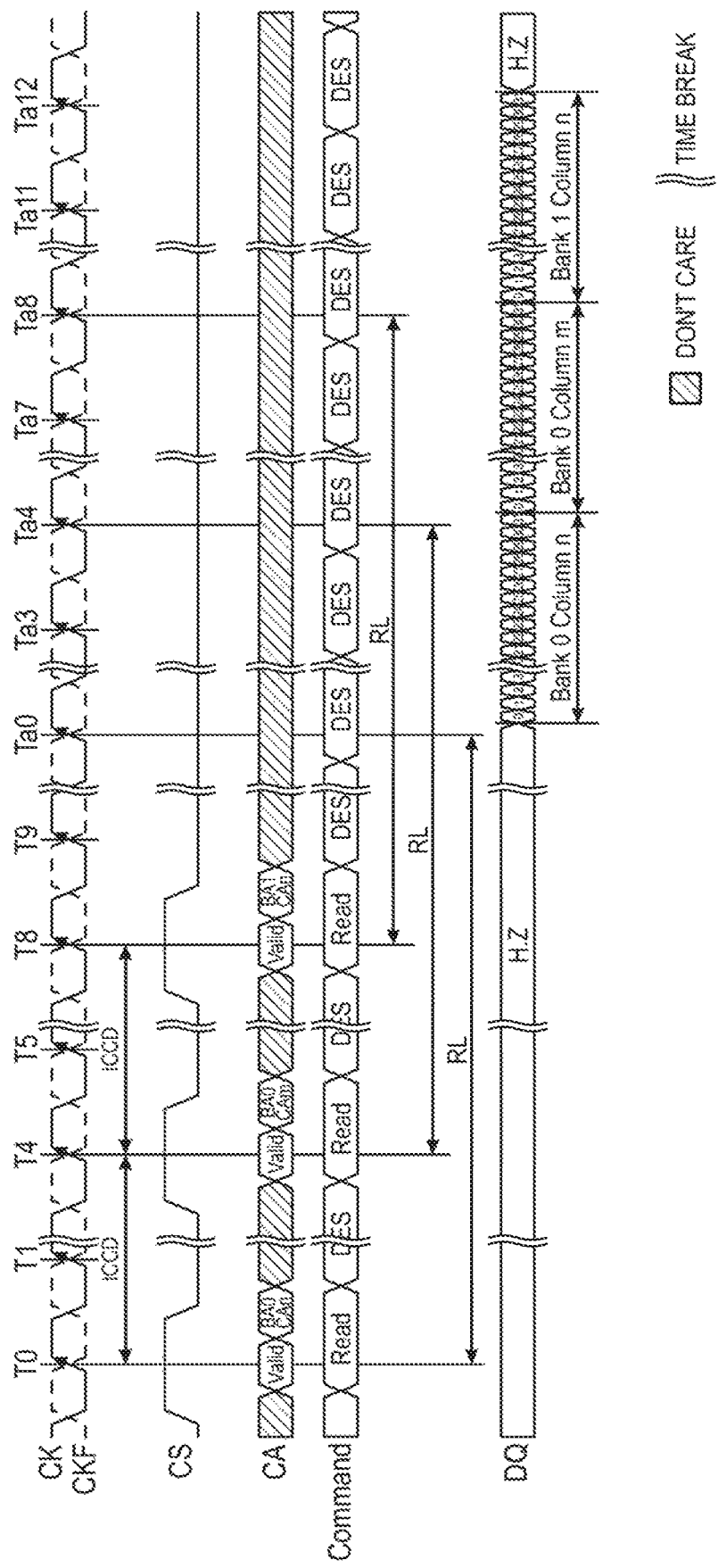
FIG. 8 is a timing diagram of various signals during operation of a semiconductor device arranged in a bank architecture with a bank mode configuration according to an embodiment of the disclosure.

An example access operation to the banks will be described with reference to FIG. 8. FIG. 8 is a timing diagram of various signals during operation of a semiconductor device arranged in a bank architecture with a bank mode configuration according to an embodiment of the disclosure. In some embodiments of the disclosure, the bank mode configuration for the example operation of FIG. 8 may be as previously described with reference to FIG. 7.

FIG. 8 illustrates an example access operation for reading data from two banks. In the example access operation, the memory banks, are arranged in a bank architecture with a bank mode configuration of 8 banks. Additionally, the ratio CKR between a data strobe clock WCK and an external clock CK is 4:1, and a burst length for the read data is 32. A latency RL is set so that data is provided at a time RL following a corresponding read command. The bank architecture may be set by programming appropriate values in a mode register for operands that correspond to a bank architecture setting. The CKR, burst length, and RL may be set by programming appropriate values in a mode register for operands in a mode register that correspond to the settings. While not shown in FIG. 8, the WCK is active during provision of data and has four times the clock frequency of the CK clock, as indicated by the CKR of 4:1. Assuming 8 external terminals DQ per data path 312 and 322, and a burst length of 32, 64 bytes of data are provided by a bank for a memory access operation (32 bytes of data from data path 312 for a first half-bank and 32 bytes of data from data path 322 for a second half-bank).

Prior to time T0, and not shown in FIG. 8, an activation command and associated memory addresses have been received by the semiconductor device. For example, in some embodiments of the disclosure, an Activate command with row memory addresses are received prior to time T0. Additionally, prior to time T0, a select signal CS becomes active to select the semiconductor device. A memory access command and associated memory addresses are also provided to the semiconductor device. At time T0 and a subsequent falling clock edge of the CK clock, the selected semiconductor device receives a Read command ("Valid") and associated memory addresses including bank address BA0 (the bank address for Bank 0) and column address CAn. As a result of the Read command and BG0 and CAn addresses, data will be read from the column address CAn in Bank 0. Data for the Read command of time T0 is provided at a time Ta0 that is RL following receipt of the Read command and associated memory addresses at time T0. 32-bits of data are provided from each of the external terminals DQ following time Ta0.

Prior to time T4, the CS signal becomes active again to select the semiconductor device, and a second memory command and associated memory addresses are provided to the semiconductor device. The semiconductor device receives the second memory command and associated memory addresses at time T4 and a subsequent falling clock edge of the CK clock. In particular, the semiconductor device receives a second Read command, as well as the memory address including bank address BA0 and column address CAm. As a result of the Read command and BA0 and CAm addresses, data will be read from the column address CAm in Bank 0. Data for the Read command of time T4 is provided at a time Ta4 that is RL following receipt of the Read command and associated memory addresses at time T4. 32-bits of data are provided from each of the external terminals DQ following time Ta4.

Prior to time T8, the CS signal becomes active again to select the semiconductor device, and a third memory command and associated memory addresses are provided to the semiconductor device. The semiconductor device receives the third memory command and associated memory addresses at time T8 and a subsequent filling clock edge of the CK clock. In particular, the semiconductor device receives a third Read command, as well as the memory address including bank address BA1 (the bank address for Bank 1) and column address CAn. As a result of the Read command and BA1 and CAn addresses, data will be read from the column address CAn in Bank 1. Data for the Read command of time T8 is provided at a time Ta8 that is RL following receipt of the Read command and associated memory addresses at time T8. 32-bits of data are provided from each of the external terminals DQ following time Ta8.

Deselect commands DES are shown in FIG. 8 in between the access commands. However, the DES commands are provided by way of example, and other commands may be provided during those times. Additionally, different, additional, and/or alternative address information to that shown in FIG. 8 for a memory command may be provided.

As illustrated by the example access operation of FIG. 8, access operations to a same bank may have the same minimum command timing as for access operations to a different bank. For example, a minimum command timing tCCD between the first Read command at time T0 to column CAn in Bank 0 and the second Read command at time T4 to column CAm in Bank 0 (i.e., the same bank) is the same tCCD between the second Read command at time T4 to column CAm in Bank 0 and the third Read command at time T8 to column CAn in Bank 1 (i.e., a different bank). In contrast, as previously described with reference to FIGS. 5 and 6, the minimum command timing tCCD_L for access operations to a same bank group is greater than the minimum command timing tCCD_S for access operations to a different bank group. Moreover, the 32-bits per access operation for the example access operation of FIG. 8 are not split into multiple bit groups separated by a time gap. The 32-bits per access operation of FIG. 8 are provided continuously until the 32-bits per external terminal DQ are complete. Additionally, data from consecutive read commands to a same bank are provided without being separated by a time gap (e.g., data for the Read command at time T4 to Bank 0 is provided immediately following the data for the Read command at time T0 to Bank 0). As a result, idle time of the external terminals DQ can be avoided with a bank mode configuration without interleaving memory access operations.

Figures 9, 12:
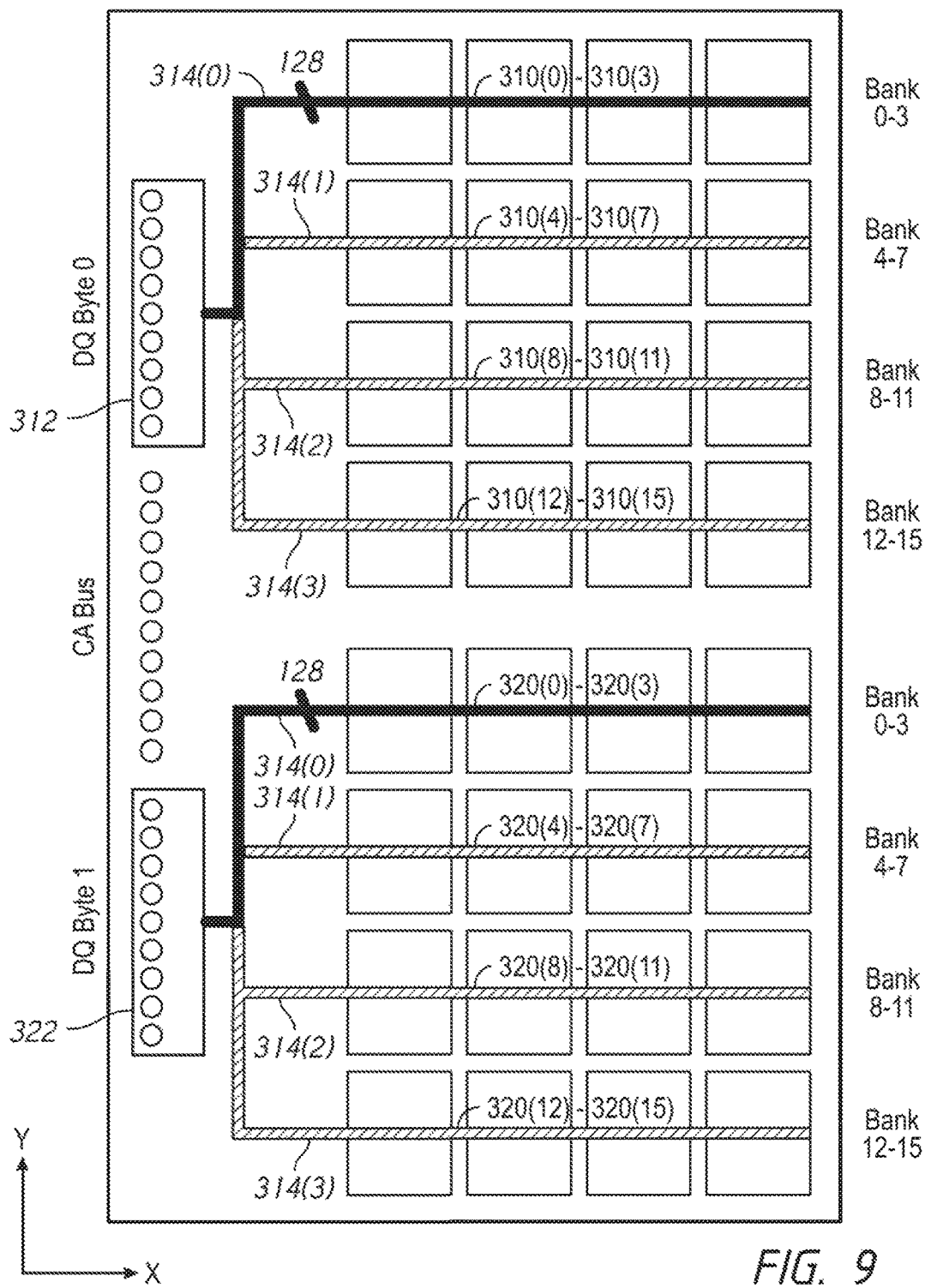
FIG. 9 is a block diagram of the portion of the semiconductor device of FIG. 3 arranged in a bank architecture according to an embodiment of the disclosure.
FIG. 12 is an address map table for accessing a memory array for different bank architectures according to an embodiment of the disclosure.

FIG. 9 is a block diagram of the portion of the semiconductor device of FIG. 3 arranged in a bank architecture according to an embodiment of the disclosure.

The bank architecture shown in FIG. 9 is a bank mode configuration according to an embodiment of the disclosure. The memory banks 310(0)-310(15) and 320(0)-320(15) are arranged into multiple banks, but without any bank groups, and each of the banks includes one or more of the memory banks 310(0)-310(15) and/or one or more of the memory banks 320(0)-320(15). In the particular example of FIG. 9, the memory banks 310(0)-310(15) and 320(0)-320(15) are arranged into 16 banks. Each of the 16 banks includes memory banks from memory banks 310(0)-310(15) and memory banks from memory banks 320(0)-320(15). For example, Bank 0 includes memory banks 310(0) and 320(0); Bank 1 includes memory banks 310(1) and 320(1); Bank 2 includes memory banks 310(2) and 320(2); Bank 3 includes memory banks 310(3) and 320(3); Bank 4 includes memory banks 310(4) and 320(4); Bank 5 includes memory banks 310(5) and 320(5); Bank 6 includes memory banks 310(6) and 320(6); Bank 7 includes memory banks 310(7) and 320(7); Bank 8 includes memory banks 310(8) and 320(8); Bank 9 includes memory banks 310(9) and 320(9); Bank 10 includes memory banks 310(10) and 320(10); Bank 11 includes memory banks 310(11) and 320(11); Bank 12 includes memory banks 310(12) and 320(12); Bank 13 includes memory banks 310(13) and 320(13); Bank 14 includes memory banks 310(14) and 320(14); and Bank 15 includes memory banks 310(15) and 320(15).

Other embodiments of the disclosure may have the banks and/or memory banks of the banks arranged in a different manner than previously described with reference to FIG. 9. For example, the memory banks may be arranged in a bank architecture with a bank mode configuration having greater or fewer number of banks and/or memory banks per bank, as well as a different arrangement of banks and/or memory banks per bank. More generally, the scope of the disclosure is not limited to the particular example previously described with reference to FIG. 9.

In operation, data may be transferred to and from the Banks 0 through 15. When a bank is accessed, data is transferred between the memory banks of the accessed bank and the data paths 312 and 322 on the respective data IO bus. Typically, full data widths of data are transferred on the respective data IO busses between memory banks 310 and the data path 312 and between memory banks 320 and the data path 322 when a bank is accessed. For example, in an embodiment where the data widths of the data IO busses 314(0)-314(3) and 324(0)-324(3) are 128-bits, when a bank is accessed, 128-bits of data is transferred on each of two data IO busses between the memory banks and the data paths: when accessing any of Banks 0 through 3, 128-bits of data is transferred on the data IO bus 314(0) and 128-bits of data is transferred on the IO bus 324(0) when accessing any of Banks 4 through 7, 128-bits of data is transferred on the data IO bus 314(1) and 128-bits of data is transferred on the IO bus 324(1); when accessing any of Banks 8-11, 128-bits of data is transferred on the data IO bus 314(2) and 128-bits of data is transferred on the IO bus 324(2); and when accessing any of Banks 12-15, 128-bits of data is transferred on the data IO bus 314(3) and 128-Bits of data is transferred on the IO bus 324(3). A total of 256-bits (e.g., 128-bits×2) are transferred when a bank is accessed.

Figure 10:
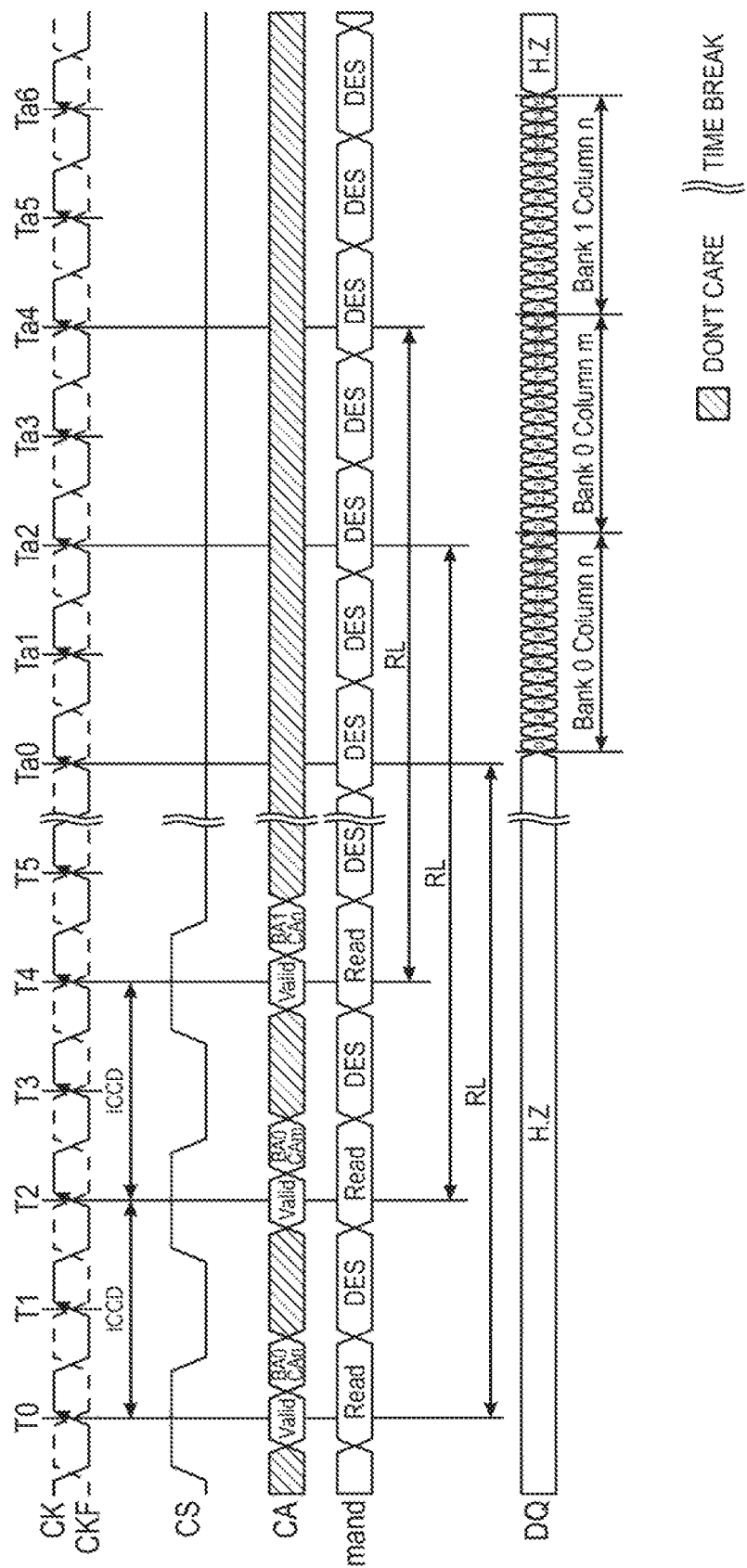
FIG. 10 is a timing diagram of various signals during operation of a semiconductor device arranged in a bank architecture with a bank mode configuration according to an embodiment of the disclosure.
Figure 11:
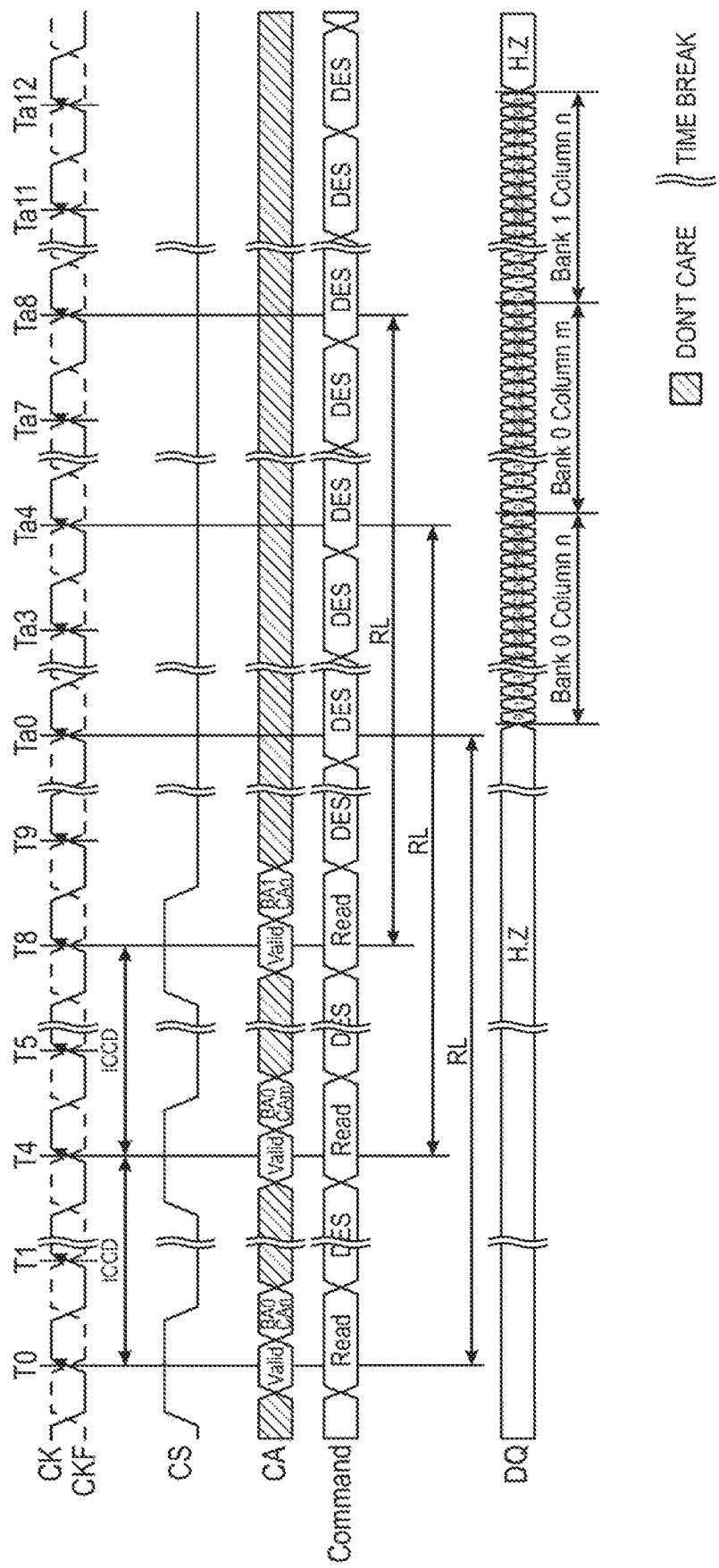
FIG. 11 is a timing diagram of various signals during operation of a semiconductor device arranged, in a bank architecture with a bank mode configuration according to an embodiment of the disclosure.

An example access operations to the banks will be described with reference to FIGS. 10 and 11. FIG. 10 is a timing diagram of various signals during operation of a semiconductor device arranged in a bank architecture with a bank mode configuration having, a 16-bit burst length according to an embodiment of the disclosure. FIG. 11 is a timing diagram of various signals during operation of a semiconductor device arranged in a bank architecture with a bank mode configuration having a 32-bit burst length according to an embodiment of the disclosure. In some embodiments of the disclosure, the bank mode configuration for the example operation of FIGS. 10 and 11 may be as previously described with reference to FIG. 9.

FIGS. 10 and 11 illustrate example access operations for reading data from two banks. In the example access operation, the memory banks are arranged in a bank architecture with a bank architecture with a bank mode configuration of 16 banks. Additionally, the ratio CKR between a data strobe clock WCK and an external clock CK is 4:1. A latency RL is set so that data is provided at a time RL following a corresponding read command. The bank architecture may be set by programming appropriate values in a mode register for operands that correspond to a bank architecture setting. The CKR, burst length, and RL may be set by programming appropriate values in a mode register for operands in a mode register that correspond to the settings. While not shown in FIGS. 10 and 11, the WCK is active during provision of data and has four times the clock frequency of the CK clock, as indicated by the CKR of 4:1.

FIG. 10 illustrates a burst length of 16-bits and FIG. 11 illustrates a burst length of 32-bits. Assuming 8 external terminals DQ per data path 312 and 322, and a burst length of 16, 32 bytes of data are provided by a bank for a memory access operation (16 bytes of data from data path 312 for a first half-bank and 16 bytes of data from data path 322 for a second half-bank). In contrast, for a burst length of 32, 64 bytes of data are provided by a bank for a memory access operation (32 bytes of data from data path 312 for a first half-bank and 32 bytes of data from data path 322 for a second half-bank).

With reference to FIG. 10, prior to time T0, an activation command and associated memory addresses (not shown in FIG. 10) have been received by the semiconductor device. For example, in some embodiments of the disclosure, an Activate command with row memory addresses are received prior to time T0. Additionally, prior to time T0, a select signal CS becomes active to select the semiconductor device. A memory access command and associated memory addresses are also provided to the semiconductor device. At time T0 and a subsequent falling clock edge of the CK clock, the selected semiconductor device receives a Read command ("Valid") and associated memory addresses including bank address BA0 (the bank address for Bank 0) and column address CAn. As a result of the Read command and BG0 and CAn addresses, data will be read from the column address CAn in Bank 0. Data for the Read command of time T0 is provided at a time Ta0 that is RL following receipt of the Read command and associated memory addresses at time T0. 16-bits of data are provided from each of the external terminals DQ following time Ta0.

Prior to time T2, the CS signal becomes active again to select the semiconductor device, and a second memory command and associated memory addresses are provided to the semiconductor device. The semiconductor device receives the second memory command and associated memory addresses at time T2 and a subsequent falling dock edge of the CK clock. In particular, the semiconductor device receives a second Read command, as well as the memory address including bank address BA0 and column address CAm. As a result of the Read command and BA0 and CAm addresses, data will be read from the column address CAm in Bank 0. Data for the Read command of time T2 is provided at a time Ta2 that is RL following receipt of the Read command and associated memory addresses at time T2. 16-bits of data are provided from each of the external terminals DQ following time Ta2.

Prior to time T4, the CS signal becomes active again to select the semiconductor device, and a third memory command and associated memory addresses are provided to the semiconductor device. The semiconductor device receives the third memory command and associated memory addresses at time T4 and a subsequent falling clock edge of the CK clock. In particular, the semiconductor device receives a third Read command, as well as the memory address including bank address BA1 (the bank address for Bank 1) and column address CAn. As a result of the Read command and BA1 and CAn addresses, data will be read from the column address CAn in Bank 1. Data for the Read command of time T4 is provided at a time Ta4 that is RL following receipt of the Read command and associated memory addresses at time T4. 16-bits of data are provided from each of the external terminals DQ following time Ta8.

As previously described, in contrast to the example access operation of FIG. 10, the example access operation of FIG. 11 has a burst length of 32-bits. With reference to FIG. 11, prior to time T0, an activation command and associated memory addresses (not shown in FIG. 11) have been received by the semiconductor device. For example, in some embodiments of the disclosure, an Activate command with row memory addresses are received prior to time T0. Additionally, prior to time T0, a select signal CS becomes active to select the semiconductor device. A memory access command and associated memory addresses are also provided to the semiconductor device. At time T0 and a subsequent falling clock edge of the CK clock, the selected semiconductor device receives a Read command ("Valid") and associated memory addresses including bank address BA0 (the bank address for Bank 0) and column address CAn. As a result of the Read command and BG0 and CAn addresses, data will be read from the column address CAn in Bank 0. Data for the Read command of time T0 is provided at a time Ta0 that is RL following receipt of the Read command and associated memory addresses at time T0. 32-bits of data are provided from each of the external terminals DQ following time Ta0.

Prior to time T4, the CS signal becomes active again to select the semiconductor device, and a second memory command and associated memory addresses are provided to the semiconductor device. The semiconductor device receives the second memory command and associated memory addresses at time T4 and a subsequent falling clock edge of the CK clock. In particular, the semiconductor device receives a second Read command, as well as the memory address including bank address BA0 and column address CAm. As a result of the Read command and BA0 and CAm addresses, data will be read from the column address CAm in Bank 0. Data for the Read command of time T4 is provided at a time Ta4 that is RL following receipt of the Read command and associated memory addresses at time T4. 32-bits of data are provided from each of the external terminals DQ following time Ta4.

Prior to time T8, the CS signal becomes active again to select the semiconductor device, and a third memory command and associated memory addresses are provided to the semiconductor device. The semiconductor device receives the third memory command and associated memory addresses at time T8 and a subsequent falling clock edge of the CK clock. In particular, the semiconductor device receives a third Read command, as well as the memory address including bank address BA1 (the bank address for Bank 1) and column address CAn. As a result of the Read command and BA1 and CAn addresses, data will be read from the column address CAn in Bank 1. Data for the Read command of time T8 is provided at a time Ta8 that is RL following receipt of the Read command and associated memory addresses at time T8. 32-bits of data are provided from each of the external terminals DQ following time Ta8.

As shown by the example access operation of FIG. 11, access operations for the bank mode configuration of 16 banks with a 32-bit burst length is similar to access operations for a bank mode configuration of 8 banks with a 32-bit burst length, such as previously described with reference to FIG. 8. As with the example access operation illustrated in FIG. 8, the 32-bits per access operation for the example access operation of FIG. 11 are not split into multiple bit groups separated by a time gap. The 32-bits per access operation are provided continuously until the 32-bits per external terminal DQ are complete. As a result, idle time of the external terminals DQ can be avoided with a bank mode configuration without interleaving memory access operations.

Deselect commands DES are shown in FIGS. 10 and 11 in between the access commands. However, the DES commands are provided by way of example, and other commands may be provided during those times. Additionally, different, additional, and/or alternative address information to that shown in FIGS. 10 and 11 for a memory command may be provided.

As illustrated by the example access operations of FIGS. 10 and 11, access operations to a same bank may have the same minimum command timing as for access operations to a different bank. For example, a minimum command timing tCCD between the first Read command to column CAn in Bank 0 and the second Read command to column CAm in bank 0 (i.e., the same bank) is the same tCCD between the second Read command to column CAm in Bank 0 and the third Read command to column CAn in Bank 1 (i.e., a different bank). In contrast, as previously described with reference to FIGS. 5 and 6, the minimum command timing tCCD_L for access operations to a same bank group is greater than the minimum command timing tCCD_S for access operations to a different bank group. Moreover, the data per access operation for the example access operation of FIGS. 10 and 11 are not split into multiple bit groups separated by a time gap. Additionally, data from consecutive read commands to a same bank are provided without being separated by a time gap (e.g., data for the second Read command to Bank 0 is provided immediately following the data for the first Read command to Bank 0). As a result, idle time of the external terminals DQ can be avoided with a bank mode configuration without interleaving memory access operations.

In contrast to the example access operation for an 8 bank mode configuration, the number of bits transferred from the memory banks to the data paths when a bank is accessed for a 16 bank mode configuration may be 256-bits, for example, as previously described with reference to FIG. 9. By providing 256-bits per bank access, as compared to 512-bits per bank access as for the example access operation for an 8 bank mode configuration (e.g., example access operation of FIG. 8 for a bank mode configuration of FIG. 7), there may be limitations as to the location from where data is read for the second Read command. There may be limitations because two memory banks per bank are accessed during the access operation, instead of four memory banks per bank, as previously described with reference to FIG. 8 for the 8 bank mode configuration of FIG. 7. There may also be limitations on the clock frequency of the CK clock with the example operations of FIGS. 10 and 11 for the 16 bank mode configuration. That is, the tCCD time for same bank access operations should be sufficiently long to allow the data IO bus and data path to prepare for another access operation to the same bank. As such, while relatively lower frequency CK clocks may provide sufficient tCCD time for back-to-back access operations to the same bank when in a 16 bank mode configuration, relatively higher frequency CK clocks may not.

As previously described, circuits of a semiconductor device may provide internal signals and decoded addresses based on the bank architecture set, for example, by information stored in a mode register. For example, with reference to the semiconductor device 200 of FIG. 2, the command decoder 215 may provide internal signals to control the circuits of the semiconductor device 200 to access the memory array 250 as arranged according to the bank architecture that is set by the information stored in the mode register 225 for bank architectures. Additionally, the address decoder 212, row decoder 240, and/or column decoder 245 may map addresses to the memory array 250 based on the bank architecture that is set in the mode register 225.

FIG. 12 is an address map table for accessing a memory array for different bank architectures according to an embodiment of the disclosure. The address map table of FIG. 12 shows address array mapping for three bank architectures, in particular, (1) a bank architecture with a bank group mode configuration ("BG"); (2) a bank architecture with a 8 bank mode configuration ("8B"); and (3) a bank architecture with a 16 bank mode configuration ("16B"). As previously described, the address may be decoded and mapped by, for example, address decoders in a semiconductor device. In the example of FIG. 12, four bits of an address for an access operation are mapped based on the bank architecture of the memory array being accessed. Other bits of the address for the access operation may be mapped the same for all of the different bank architectures. As shown in the example of FIG. 12, when the memory array has a bank architecture with a bank group mode configuration, the four bits of the address are mapped as two address bits for a bank address (BA0 and BA1) and two address bits for a bank group address (BG0 and BG1). In contrast, when the memory array has a bank architecture with an 8 bank mode configuration, the four bits of the address are mapped as three address bits for a bank address (BA0, BA1, and BA2) and one address bit for a starting address of the access operation (Burst Starting Address B4). When the memory array has a bank architecture with a 16 bank mode configuration, the four bits of the address are mapped as four address bits for a bank address (BA0, BA1, BA2, and BA3). In some embodiments of the disclosure, the particular four bits of the address that are mapped based on the bank architecture set for the memory array may be the same for the different bank architectures.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
    a mode register configured to store information related to bank architecture; and
    a memory array including a plurality of memory banks, the plurality of memory banks configured to be arranged in a bank architecture based at least in part on the information related to bank architecture stored in the mode register, wherein the plurality of memory banks of the memory array includes a first half-bank and a second half-bank, and for a bank architecture with bank group mode configuration data is provided from both the first half-bank and the second half-bank when the plurality of memory banks are accessed.

2. The apparatus of claim 1 wherein the bank group mode configuration comprises n banks and m bank groups, wherein each of the n banks includes memory banks of the plurality of memory banks and each of the m bank groups includes memory banks included with each of the n banks, wherein n and m are both non-zero whole numbers.

3. The apparatus of claim 2 wherein each of the bank groups transfer data to and from a data path on a respective data bus.

4. The apparatus of claim 2 wherein n is four and m is four.

5. The apparatus of claim 1 wherein the bank architecture comprises a bank mode configuration.

6. The apparatus of claim 5 wherein the bank mode configuration comprises p banks, each of the p banks including q memory banks of the plurality of memory banks, wherein p and q are both non-zero whole numbers.

7. The apparatus of claim 6 wherein p is eight and q is four.

8. The apparatus of claim 6 wherein p is sixteen and q is two.

9. The apparatus of claim 1 wherein an amount of data for data prefetch of the memory array is based at least in part on the bank architecture.

10. An apparatus, comprising:
external data terminals;
a data path configured to provide data to and from the external data terminals; and
a plurality of data busses configured to transfer data between the plurality of memory banks and the data path, wherein each of the plurality of data busses has a first data width and wherein each of the data paths has a second data width that is different from the first data width;
a command decoder configured to receive and decode an access command and provide internal signals responsive thereto;
an address decoder configured to receive an address associated with the access command and provide decoded address signals responsive thereto;
a mode register configured to be programmed with a value for a bank architecture setting; and
a memory array including a plurality of memory banks, the plurality of memory banks configured to be accessed responsive to the internal signals, wherein the plurality of memory banks are arranged according to a bank architecture that is selected at least in part on the bank architecture setting, and wherein the address decoder is configured to map at least a portion of the decoded address signals to the plurality of memory banks based on the selected bank architecture to access the plurality of memory banks according to the selected bank architecture.

11. The apparatus of claim 10 wherein the bank architecture is selected from at least a bank architecture with a bank group mode configuration and a bank architecture with a bank mode configuration.

12. The apparatus of claim 10 wherein the data path comprises read/write amplifiers and an input/output circuit.

13. The apparatus of claim 10 wherein the first data width is one-half the second data width.

14. The apparatus of claim 10 wherein the plurality of memory banks comprises a first half-bank and a second half-bank, and data is provided from both the first half-bank and the second half-bank when the plurality of memory banks are accessed.

15. The apparatus of claim 10 wherein the address decoder is configured to map decoded bank address signals according to the selected bank architecture.

16. An apparatus, comprising:
a controller configured to provide access commands and associated addresses;
a plurality of busses coupled to the controller and configured to provide signals and clocks to and from the controller; and
a memory system coupled to the plurality of busses and configured to receive the access commands and the associated addresses, the memory system including a plurality of memory banks and a mode register, the mode register configured to be programmed with first values corresponding to a bank architecture setting for a first frequency set point and programmed with second values corresponding to a bank architecture setting for a second frequency set point,
wherein the controller accesses the plurality of memory banks of the memory according to a selected bank architecture that is based on the value corresponding to the bank architecture setting in the mode register.

17. The apparatus of claim 16 wherein the selected bank architecture comprises at least one of a bank architecture with a bank group mode configuration and a bank architecture with a bank mode configuration.

18. The apparatus of claim 16 wherein the mode register is further configured to be programmed with a value corresponding to a burst length setting, and wherein the controller is further accesses the plurality of memory banks of the memory according to a burst length that is based on the value corresponding to a burst length setting in the mode register.

19. A method, comprising:
receiving an access command and associated address;
accessing a plurality of memory banks of a memory array, wherein the plurality of memory banks are arranged in a bank architecture; and
providing to external data terminals data from memory locations in the plurality of memory banks that correspond to the associated address, wherein the data from the memory locations are provided to the external terminals having a timing based at least in part on the bank architecture of the plurality of memory banks,
wherein for a bank architecture with bank group mode configuration, data for an access command for a first burst length is provided to the external data terminals in one hit group and data for the access command for a second burst length is provided to the external data terminals split into multiple bit groups separated by a time gap.

20. The method of claim 19 wherein for the first burst length data for a first access command to a first bank group and data for a second access command to the first bank group are provided with a time gap therebetween.

21. The method of claim 19 wherein for the bank group mode configuration a minimum timing for first and second access commands to a same bank group is greater than a minimum timing for first and second access commands to different bank groups.

22. The method of claim 19 wherein the bank architecture comprises a bank mode configuration and wherein data for a first access command to a first bank and data for a second access command to the first bank are provided without a time gap.

23. The method of claim 19 wherein the bank architecture comprises a bank mode configuration and wherein a minimum timing for first and second access commands to a same bank group is the same as a minimum timing for first and second access commands to different bank groups.

24. A method, comprising:
receiving an access command and associated address;
accessing a plurality of memory banks of a memo array, wherein the plurality of memory banks are arranged in a bank architecture; and
providing to external data terminals data from memory locations in the plurality of memory banks that correspond to the associated address, wherein the data from the memory locations are provided to the external terminals having a timing based at least in part on the bank architecture of the plurality of memory banks,
wherein the bank architecture comprises a bank group mode configuration and wherein data for a first access command to a first bank group and data for a second access command to the first bank group are provided with a time gap therebetween, and
wherein data for a third access command to a second bank group is provided during the gap between the data for the first access command and the data for the second access command.

25. A method, comprising:
programming a value in a mode register of a memory for operands corresponding to one bank architecture selected from a set of three bank architectures, wherein each bank architecture of the set comprises a plurality of memory banks of the memory arranged according to the bank architecture selected by the value programmed in the mode register;
providing a read/write command to the memory to access the plurality of memory banks according to the bank architecture, wherein behavior of the memory resulting from the read/write command depends at least in part on the selected bank architecture; and
for a hank architecture with bank group mode configuration receiving data for a read command in one bit group for a first burst length and receiving data for a read command in multiple bit groups separated by a time gap.

26. The method of claim 25, further comprising receiving data responsive to the access command having a first timing for a first bank architecture or having second timing for a second bank architecture.

27. The method of claim 25 wherein providing an access command to the memory comprises providing a first command and a second command having a first minimum timing when accessing a same bank group for a bank architecture with bank group mode configuration, and having a second minimum timing when accessing different bank groups for the bank architecture with bank group mode configuration.

28. The method of claim 25 wherein providing an access command to the memory comprises providing a first command and a second command having a minimum timing when accessing a same bank for a bank architecture with bank mode configuration, and having the minimum timing when accessing different banks for the bank architecture with bank mode configuration.

29. A method, comprising:
receiving a memory command and associated address;
mapping a portion of the associated address to access a plurality of memory banks of a memory array based at least in part on a value programmed in a mode register corresponding to a bank architecture setting; and
accessing the plurality of memory banks of the memory array according to a bank architecture set by the value programmed in the mode register, wherein the plurality of memory banks of the memory array includes a first half-bank and a second half-bank, and for a bank architecture with bank group mode configuration data is provided from both the first half-bank and the second half-bank when the plurality of memory banks are accessed.

30. The method of claim 29 wherein the associated address includes a bank address and wherein the portion of the associated address that is mapped comprises at least a portion of the bank address.

31. The method of claim 29 wherein the bank architecture comprises a bank architecture with a bank group mode configuration, and wherein the portion of the associated address that is mapped comprises a bank address and a bank group address.

* * * * *